United States Patent
Kawaguchi

(10) Patent No.: US 8,445,185 B2
(45) Date of Patent: May 21, 2013

(54) METHOD OF MANUFACTURING PIEZOELECTRIC VIBRATING REED, PIEZOELECTRIC VIBRATING REED, PIEZOELECTRIC VIBRATOR, OSCILLATOR, ELECTRONIC APPARATUS, AND RADIO-CONTROLLED TIMEPIECE

(75) Inventor: Masayuki Kawaguchi, Chiba (JP)

(73) Assignee: Seiko Instruments Inc., Chiba (JP)

( * ) Notice: Subject to any disclaimer, the term of this patent is extended or adjusted under 35 U.S.C. 154(b) by 232 days.

(21) Appl. No.: 12/950,737

(22) Filed: Nov. 19, 2010

(65) Prior Publication Data
US 2011/0127883 A1    Jun. 2, 2011

(30) Foreign Application Priority Data
Nov. 30, 2009    (JP) .................. 2009-272376

(51) Int. Cl.
*G03F 7/20* (2006.01)
*H03H 3/02* (2006.01)

(52) U.S. Cl.
USPC .......... 430/316; 430/319; 430/320; 29/25.35

(58) Field of Classification Search .................. None
See application file for complete search history.

(56) References Cited

U.S. PATENT DOCUMENTS

| | | | |
|---|---|---|---|
| 4,727,234 A * | 2/1988 | Oprysko et al. | 219/121.6 |
| 2002/0023907 A1* | 2/2002 | Morishige | 219/121.85 |
| 2005/0084767 A1* | 4/2005 | Zait et al. | 430/5 |

FOREIGN PATENT DOCUMENTS

| | | |
|---|---|---|
| JP | 2002-261557 A | 9/2002 |
| JP | 2004-120351 A | 4/2004 |
| JP | 2009-088753 A | 4/2009 |

\* cited by examiner

*Primary Examiner* — John A. McPherson
(74) *Attorney, Agent, or Firm* — Brinks Hofer Gilson & Lione

(57) ABSTRACT

There are provided a method of manufacturing a piezoelectric vibrating reed capable of improving the reliability of a product by sorting out a defective product correctly, a piezoelectric vibrating reed, a piezoelectric vibrator having a piezoelectric vibrating reed, an oscillator, an electronic apparatus, and a radio-controlled timepiece. In a resist pattern forming step, a resist pattern is formed by performing contact exposure on a photoresist film in a state where a photomask is in close contact with the photoresist film. Before the resist pattern forming step, a photomask treatment step is included in which when a defect is found in an outer shape equivalent region equivalent to the outer pattern in the photomask, a part of a light shielding film pattern is removed to change the shape of the outer shape equivalent region where damage is present.

8 Claims, 18 Drawing Sheets

METHOD OF MANUFACTURING PIEZOELECTRIC VIBRATING REED, PIEZOELECTRIC VIBRATING REED, PIEZOELECTRIC VIBRATOR, OSCILLATOR, ELECTRONIC APPARATUS, AND RADIO-CONTROLLED TIMEPIECE

RELATED APPLICATIONS

This application claims priority under 35 U.S.C. §119 to Japanese Patent Application No. 2009-272376 filed on Nov. 30, 2009, the entire content of which is hereby incorporated by reference.

BACKGROUND OF THE INVENTION

1. Field of the Invention

The present invention relates to a method of manufacturing a piezoelectric vibrating reed, a piezoelectric vibrating reed, a piezoelectric vibrator having a piezoelectric vibrating reed, an oscillator, an electronic apparatus, and a radio-controlled timepiece.

2. Description of the Related Art

In recent years, piezoelectric vibrators using crystal or the like are used in mobile phones or portable information terminals as a time source, a control signal timing source, a reference signal source, and the like. Various piezoelectric vibrators are available as such kinds of piezoelectric vibrators, and a piezoelectric vibrator having a tuning fork type vibrating reed is also known as one of the piezoelectric vibrators. This piezoelectric vibrating reed has a pair of vibrating arms disposed in parallel and a base portion which integrally fixes base end sides of the pair of vibrating arms, and vibrates at a predetermined resonance frequency in a direction of moving closer to or away from each other.

For example, a method of manufacturing a piezoelectric vibrating reed is disclosed in JP-A-2002-261557, JP-A-2004-120351, and JP-A-2009-88753. Here, patterning of the outer shape of a piezoelectric vibrating reed will be specifically described. First, a metal film is formed on a wafer made of crystal, for example, and then a resist film is formed on the metal film. Then, using a photolithographic technique, the resist film is patterned by exposure and development performed through a light shielding film pattern of a photomask. As a result, a resist pattern based on the outer shape of the piezoelectric vibrating reed is formed. Then, the metal film is etched using the resist pattern as a mask. As a result, a metal film pattern is formed in which the metal film other than a region protected by the resist pattern has been selectively removed. Then, by etching the wafer using the metal film pattern as a mask, the wafer other than a region protected by the metal film pattern is selectively removed. Thus, the outer shape of the piezoelectric vibrating reed can be formed.

Moreover, at the time of exposure described above, contact exposure may be adopted in which exposure is performed using a negative resist film in a state where the resist film and a photomask are in close contact with each other. In this contact exposure, it is possible to reduce the amount of light entering between the resist film and the photomask because the resist film and the photomask are in close contact with each other. As a result, since the resolution at the time of exposure is improved, the resist pattern can be formed with high dimensional accuracy.

In the case where the resist film is patterned by the contact exposure described above, however, a foreign matter may enter between the photomask and the resist film. As a result, there is a possibility that damage, such as a crack, will occur in an outer shape equivalent region which is equivalent to the outer shape of the piezoelectric vibrating reed in the photomask. In the damaged portion, the transmittance of light at the time of exposure is decreased compared with that in a non-defective portion with no damage. Accordingly, the photoresist film of the region equivalent to the damaged portion is also affected by the damage. That is, the same damage as in the outer shape equivalent region is also transferred to the resist pattern. Accordingly, since the metal film is abnormally etched due to etchant permeating into the damaged portion of the resist pattern when forming a metal film pattern, there is a problem that the metal film pattern is difficult to form in a desired shape. As a result, at the time of subsequent patterning of a wafer, the wafer is abnormally etched. In this case, there is a problem that the obtained shape is defective or recessed (so-called crystal defect) since forming the piezoelectric vibrating reed in the desired outer shape is not possible. A photomask is repeatedly used by washing it after exposure. However, once the photomask is damaged, it is not possible to manufacture a non-defective piezoelectric vibrating reed in the damaged portion.

For this reason, electrical properties, such as a resonance frequency, are tested in the final step in order to sort out defective piezoelectric vibrating reeds and non-defective piezoelectric vibrating reeds. However, depending on the position or the size of a crystal defect, defective piezoelectric vibrating reeds may not be correctly sorted out. In this case, if a defective piezoelectric vibrating reed is distributed in the market and used as a product, there is a problem that the piezoelectric vibrating reed easily breaks with a place of a crystal defect as a starting point by impact, fatigue, or the like.

SUMMARY OF THE INVENTION

The invention has been made in view of the above problems, and it is an object of the invention to provide a method of manufacturing a piezoelectric vibrating reed capable of improving the reliability of a product by sorting out a defective product correctly, a piezoelectric vibrating reed, a piezoelectric vibrator having a piezoelectric vibrating reed, an oscillator, an electronic apparatus, and a radio-controlled timepiece.

In order to solve the problems, the invention provides the following means.

According to an aspect of the invention, a method of manufacturing a piezoelectric vibrating reed includes: a step of forming a mask material pattern by patterning a mask material formed on a processing object on which an outer pattern is to be formed; and a step of forming the outer pattern by removing the processing object in a region other than a region where the mask material pattern is formed. In the mask material pattern forming step, using a photomask in which a light shielding film pattern is formed on a substrate having optical transparency, the mask material pattern is formed by performing contact exposure on the mask material in a state where the photomask is in close contact with the mask material. A photomask treatment step, in which when a defect is found in an outer shape equivalent region equivalent to the outer pattern in the photomask, a part of the light shielding film pattern is removed to change the shape of the outer shape equivalent region where the defect is present, is included before the mask material pattern forming step.

According to this configuration, since the contact exposure is performed in a state where the shape of the outer shape equivalent region, in which a defect is present, has been changed in advance in the photomask treatment step, a mask material patterned by the outer shape equivalent region where the defect is present is formed in a defective mask material pattern having a different shape from a non-defective mask material pattern patterned by a non-defective outer shape equivalent region. In this way, the shape of the outer pattern obtained by patterning using the defective mask material pattern and the shape of the outer pattern obtained by patterning using the non-defective mask material pattern can be made to be different from each other in a positive way. Accordingly, in the electrical property test or the like which is a final step, a clear difference of electrical properties occurs between a defective product and a non-defective product. As a result, only a non-defective product can be distributed to the market since a defective product and a non-defective product can be correctly sorted out. Thus, it is possible to provide a reliable piezoelectric vibrating reed excellent in the vibration characteristic.

In addition, the piezoelectric vibrating reed may include a pair of vibrating arms disposed in parallel and a base portion which integrally fixes base end sides of the pair of vibrating arms. An outer shape forming step, in which the outer shape of the piezoelectric vibrating reed is formed by patterning a wafer made of a piezoelectric material using the outer pattern as a mask, may be included after the outer pattern forming step.

According to this configuration, in the outer shape forming step, a wafer is patterned using outer patterns whose shapes are clearly different between a non-defective product and a defective product. Accordingly, the outer shapes of piezoelectric vibrating reeds can be made to be clearly different between a non-defective product and a defective product. As a result, since a clear difference of electrical properties occurs between the non-defective product and the defective product in the electrical property test or the like in the final step, the non-defective product and the defective product can be correctly sorted out.

In addition, the mask material may be a negative resist, and the light shielding film pattern may be formed in a region other than the outer shape equivalent region on the substrate. In the photomask treatment step, the shape of the outer shape equivalent region may be changed such that regions equivalent to the pair of vibrating arms are connected to each other.

According to this configuration, a piezoelectric vibrating reed in which vibrating arms are connected to each other is formed by changing the shape of the outer shape equivalent region such that regions equivalent to the vibrating arms are connected to each other in the photomask treatment step. In this case, since the piezoelectric vibrating reed in which the vibrating arms are connected to each other does not vibrate, a defective product and a non-defective product can be correctly sorted out in the electrical property test or the like.

In addition, the mask material may be a positive resist, and the light shielding film pattern may be formed in the outer shape forming region on the substrate. In the photomask treatment step, the shape of the outer shape equivalent region may be changed such that the light shielding film pattern of a region equivalent to at least one of the pair vibrating arms is cut off.

According to this configuration, a piezoelectric vibrating reed which does not have at least one of the vibrating arms is formed by changing the shape of the outer shape equivalent region such that a light shielding film pattern of a region equivalent to at least one of the vibrating arms is cut off in the photomask treatment step. In this case, since this piezoelectric vibrating reed does not vibrate, a defective product and a non-defective product can be correctly sorted out in the electrical property test or the like.

Moreover, an electrical property test step of checking whether or not electrical properties of the piezoelectric vibrating reed are in a predetermined range may be included after the outer pattern forming step. In the photomask treatment step, the shape of the outer shape equivalent region may be changed such that electrical properties of the piezoelectric vibrating reed, which is formed from the outer shape equivalent region where the defect is present, deviate from the predetermined range in the electrical property test step.

According to this configuration, a defective product and a non-defective product can be correctly sorted out by changing the shape of the outer shape equivalent region in the photomask treatment step such that the electrical properties of the piezoelectric vibrating reed, which is formed from the outer shape equivalent region where a defect is present, deviate from the predetermined range in the electrical property test step.

In addition, according to another aspect of the invention, there is provided a piezoelectric vibrating reed manufactured using the above-described method of manufacturing a piezoelectric vibrating reed.

According to this configuration, since the piezoelectric vibrating reed is manufactured using the above-described method of manufacturing a piezoelectric vibrating reed, it is possible to provide a very reliable piezoelectric vibrating reed excellent in the vibration characteristic.

In addition, according to still another aspect of the invention, there is provided a piezoelectric vibrator in which the above-described piezoelectric vibrating reed is sealed in an airtight package.

According to this configuration, since the above-described piezoelectric vibrating reed is sealed in an airtight package, it is possible to provide a very reliable piezoelectric vibrator excellent in the vibration characteristic.

In addition, according to still another aspect of the invention, there is provided an oscillator in which the above-described piezoelectric vibrator is electrically connected to an integrated circuit as a vibrator.

In addition, according to still another aspect of the invention, there is provided an electronic apparatus in which the above-described piezoelectric vibrator is electrically connected to a timepiece section.

In addition, according to still another aspect of the invention, there is provided a radio-controlled timepiece in which the above-described piezoelectric vibrator is electrically connected to a filter section.

Since each of the oscillator, the electronic apparatus, and the radio-controlled timepiece includes the above-described piezoelectric vibrator, it is possible to provide very reliable products similar to the piezoelectric vibrator.

According to the method of manufacturing a piezoelectric vibrating reed and the piezoelectric vibrating reed according to the aspects of the invention, only a non-defective product can be distributed to the market since a defective product and a non-defective product can be correctly sorted out. Therefore, it is possible to provide a reliable piezoelectric vibrating reed excellent in the vibration characteristic.

In the piezoelectric vibrator according to the aspect of the invention, the above-described piezoelectric vibrating reed is sealed in the airtight package. Therefore, it is possible to provide a very reliable piezoelectric vibrator excellent in the vibration characteristic.

Since each of the oscillator, the electronic apparatus, and the radio-controlled timepiece includes the above-described piezoelectric vibrator, it is possible to provide very reliable products similar to the piezoelectric vibrator.

DETAILED DESCRIPTION OF THE PREFERRED EMBODIMENTS

Hereinafter, an embodiment of the invention will be described with reference to the accompanying drawings.
(Piezoelectric Vibrator)

Figure 1:
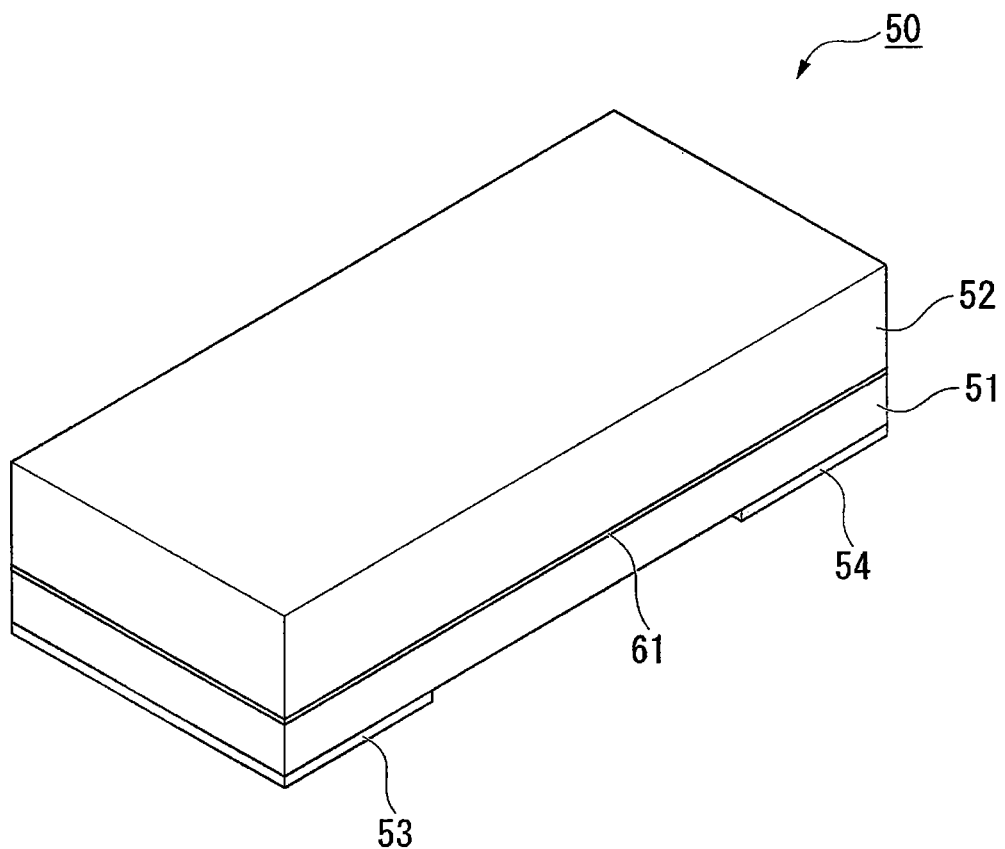
FIG. 1 is a perspective view showing the external appearance of a piezoelectric vibrator according to an embodiment of the invention.
Figure 2:
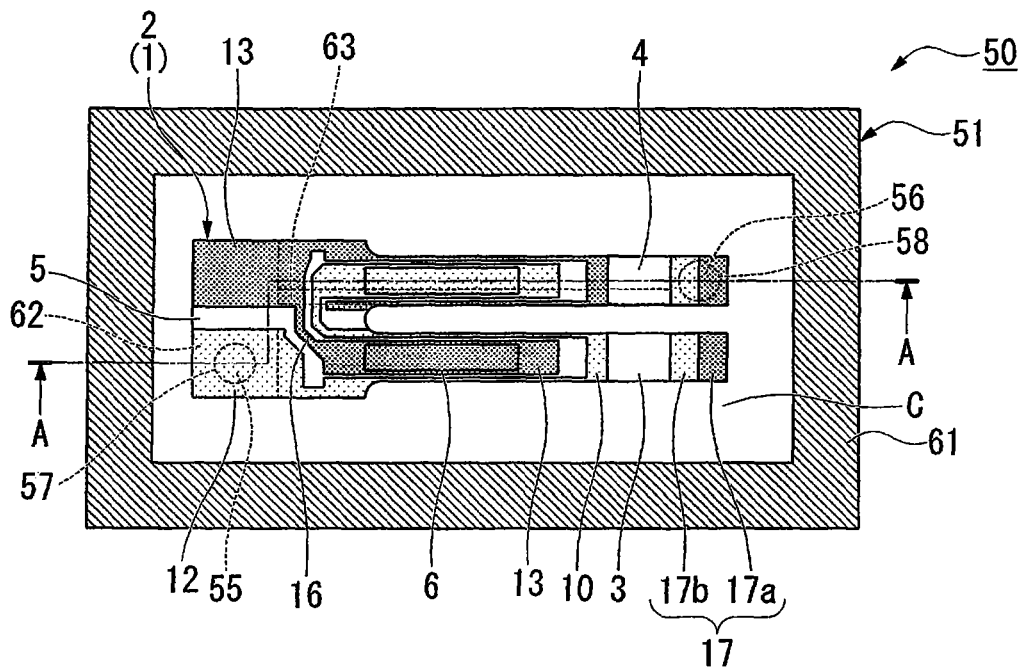
FIG. 2 is a view showing the internal configuration of the piezoelectric vibrator shown in FIG. 1 when a piezoelectric vibrating reed is viewed from above with a lid board removed.
Figure 3:
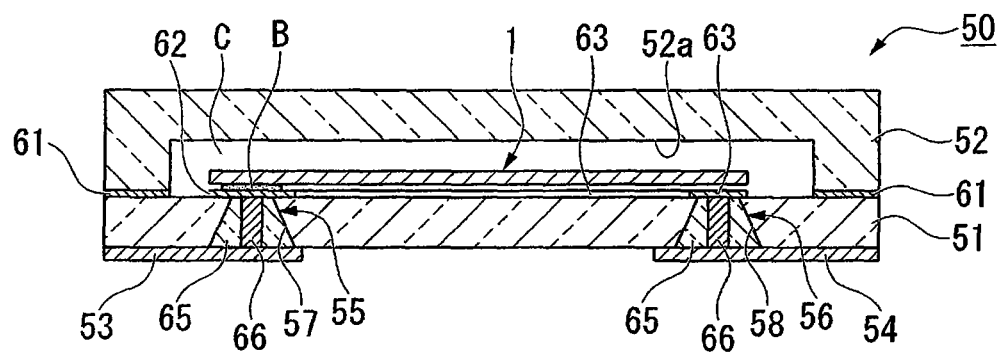
FIG. 3 is a sectional view of the piezoelectric vibrator taken along the line A-A in FIG. 2.
Figure 4:
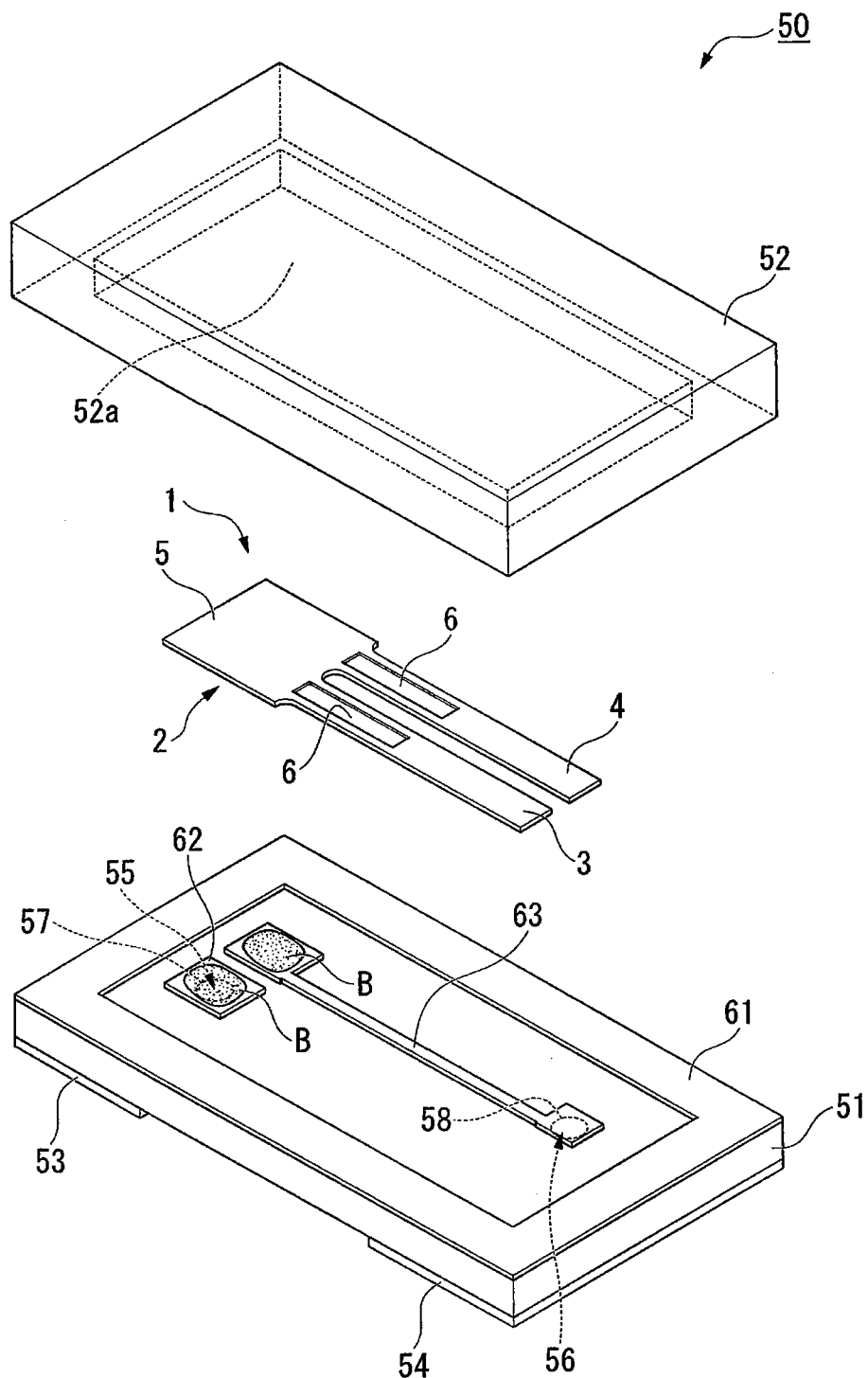
FIG. 4 is an exploded perspective view of the piezoelectric vibrator shown in FIG. 1.

FIG. 1 is a perspective view showing the external appearance of a piezoelectric vibrator in the present embodiment. FIG. 2 is a view showing the internal configuration of the piezoelectric vibrator when a piezoelectric vibrating reed is viewed from above with a lid board removed. In addition, FIG. 3 is a sectional view of the piezoelectric vibrator taken along the line A-A in FIG. 2, and FIG. 4 is an exploded perspective view of the piezoelectric vibrator.

As shown in FIGS. 1 to 4, a piezoelectric vibrator 50 is formed in a box shape in which two layers of a base board 51 and a lid board 52 are laminated, and is a surface mount type piezoelectric vibrator 50 in which a piezoelectric vibrating reed 1 is housed in an internal cavity C. In addition, external electrodes 53 and 54 provided at the outer sides of the piezoelectric vibrating reed 1 and the base board 51 are electrically connected to each other through a pair of penetration electrodes 55 and 56 which pass through the base board 51.

The base board 51 is a transparent insulating board made of a glass material, for example, soda lime glass, and is formed in a plate shape. A pair of through holes 57 and 58, in which the pair of penetration electrodes 55 and 56 is formed, is formed in the base board 51. Each of the through holes 57 and 58 has a tapered sectional shape the diameter of which gradually decreases from the outer end surface (lower surface in FIG. 3) of the base board 51 toward the inner end surface (upper surface in FIG. 3).

Similar to the base board 51, the lid board 52 is also a transparent insulating board made of a glass material, for example, soda lime glass, and is formed in a plate shape of a size such that it can be superimposed on the base board 51. In addition, a rectangular recess 52a in which the piezoelectric vibrating reed 1 is housed is formed at the bonding surface side of the lid board 52 to which the base board 51 is bonded.

This recess 52a forms the cavity C in which the piezoelectric vibrating reed 1 is housed when the base board 51 and the lid board 52 are superimposed.

In addition, a bonding layer 61 for anodic bonding made of a conductive material (for example, aluminum) is formed on the inner end surface side (bonding surface side to which the lid board 52 is bonded) of the base board 51. The bonding layer 61 is formed to have a thickness of about 3000 Å to 5000 Å, for example. In addition, the bonding layer 61 is formed along the peripheral edge of the base board 51 so as to surround the periphery of the recess 52a formed in the lid board 52. In addition, the base board 51 and the lid board 52 are anodically bonded to each other with the bonding layer 61 interposed therebetween in a state where the recess 52a faces the bonding surface side of the base board 51.

In addition, the external electrodes 53 and 54 are provided at both ends in the longitudinal direction on the outer end surface of the base board 51, and are electrically connected to the piezoelectric vibrating reed 1 through the penetration electrodes 55 and 56 and lead-out electrodes 62 and 63. More specifically, one external electrode 53 is electrically connected to one mount electrode 12, which will be described later, of the piezoelectric vibrating reed 1 through one penetration electrode 55 and one lead-out electrode 62. In addition, the other external electrode 54 is electrically connected to the other mount electrode 13, which will be described later, of the piezoelectric vibrating reed 1 through the other penetration electrode 56 and the other lead-out electrode 63.

The penetration electrodes 55 and 56 are formed by a cylinder 65 and a core portion 66 which are integrally fixed to the through holes 57 and 58 by baking, respectively. The penetration electrodes 55 and 56 serves to maintain the airtightness in the cavity C by keeping the through holes 57 and 58 airtight completely and also to make the external electrodes 53 and 54 electrically connected to the lead-out electrodes 62 and 63, respectively. Specifically, one penetration electrode 55 is located below the lead-out electrode 62 between the external electrode 53 and a base portion 5, which will be described later, of the piezoelectric vibrating reed 1, and the other penetration electrode 56 is located below the lead-out electrode 63 between the external electrode 54 and a vibrating arm 4, which will be described later, of the piezoelectric vibrating reed 1.

The cylinder 65 is formed by baking paste-like glass frit. The cylinder 65 is formed in the cylindrical shape both ends of which are flat and which has approximately the same thickness as the base board 51. In addition, the core portion 66 is disposed at the center of the cylinder 65 so as to pass through a middle hole of the cylinder 65. Moreover, in the present embodiment, the outer shape of the cylinder 65 is formed as a conical shape (tapered sectional shape) according to the shapes of the through holes 57 and 58. In addition, the cylinder 65 is baked in a state embedded in each of the through holes 57 and 58 to be firmly fixed to each of the through holes 57 and 58.

The core portion 66 is a conductive core which is formed in the cylindrical shape using a metal material. Similar to the cylinder 65, the core portion 66 is formed to have both ends, which are flat, and to have approximately the same thickness as the base board 51.

In addition, the electrical conductivity of the penetration electrodes 55 and 56 is ensured through the conductive core portion 66.

(Piezoelectric Vibrating Reed)

Figure 5:
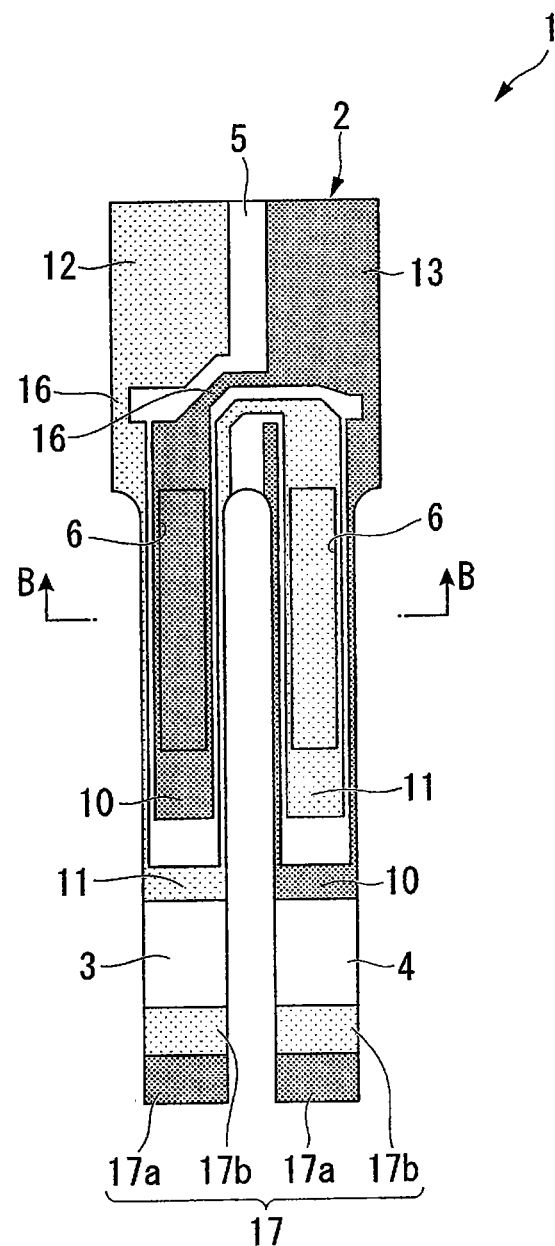
FIG. 5 is a plan view when a piezoelectric vibrating reed is viewed from above.
Figure 6:
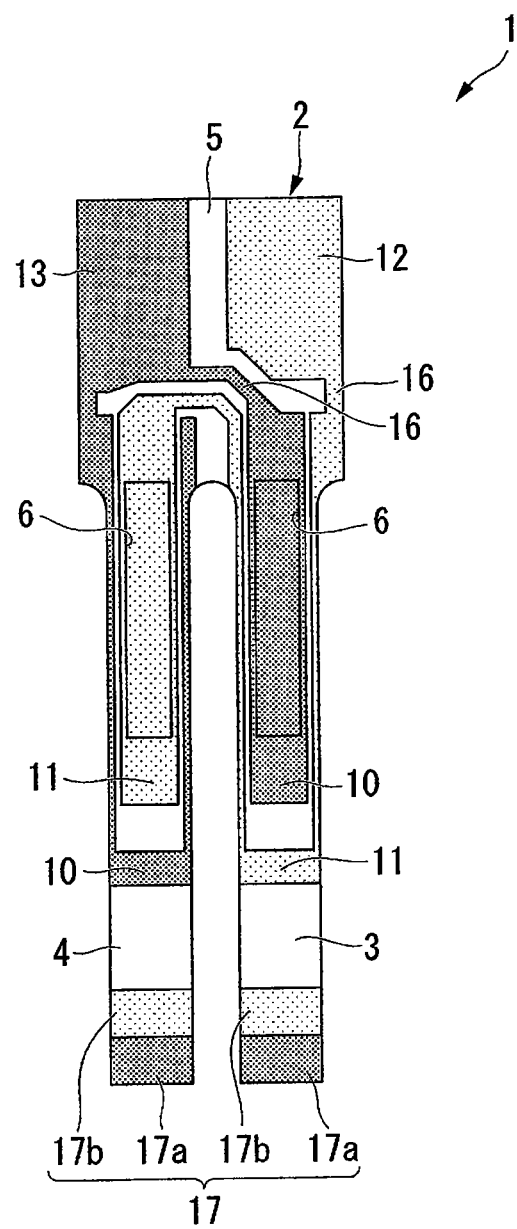
FIG. 6 is a plan view when a piezoelectric vibrating reed is viewed from below.

FIG. 5 is a plan view when a piezoelectric vibrating reed is viewed from above, and FIG. 6 is a plan view when the piezoelectric vibrating reed is viewed from below.

As shown in FIGS. 5 and 6, the piezoelectric vibrating reed 1 according to the present embodiment includes a tuning fork type piezoelectric plate 2 formed of a piezoelectric material, such as crystal, lithium tantalite, or lithium niobate.

Figure 7:
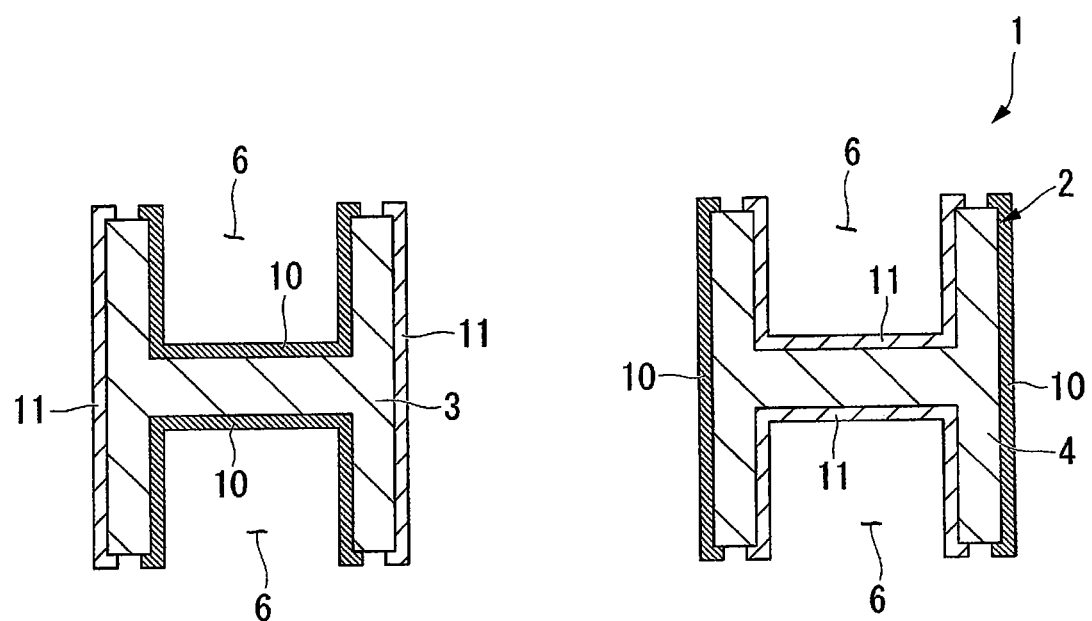
FIG. 7 is a sectional view of a piezoelectric vibrator taken along the line B-B in FIG. 5.

The piezoelectric plate 2 has a pair of vibrating arms 3 and 4 disposed in parallel and a base portion 5 which integrally fixes base end sides of the pair of vibrating arms 3 and 4. Moreover, on the upper and lower surfaces of the pair of vibrating arms 3 and 4, grooves 6 are formed with a fixed distance therebetween along the longitudinal direction from the base ends toward the distal ends of the vibrating arms 3 and 4. The grooves 6 are formed in a range exceeding intermediate portions from the base end sides of the vibrating arms 3 and 4. As a result, each of the pair of vibrating arms 3 and 4 has an H-shaped section as shown in FIG. 7. In addition, FIG. 7 is a sectional view taken along the line A-A in FIG. 1.

On the outer surface of the piezoelectric plate 2 formed as described above, a pair of excitation electrodes 10 and 11 and a pair of mount electrodes 12 and 13 are formed, as shown in FIGS. 5 and 6. Among them, the pair of excitation electrodes 10 and 11 is electrodes that vibrate the pair of vibrating arms 3 and 4 at a predetermined resonance frequency in a direction of moving closer to or away from each other when a voltage is applied. The pair of excitation electrodes 10 and 11 is mainly formed on the outer surfaces of the vibrating arms 3 and 4 by patterning in an electrically isolated state. Specifically, as shown in FIG. 7, one excitation electrode 10 is mainly formed inside the groove 6 of one vibrating arm 3 and on the side surface of the other vibrating arm 4, and the other excitation electrode 11 is mainly formed on the side surface of one vibrating arm 3 and inside the groove 6 of the other vibrating arm 4.

Moreover, as shown in FIGS. 5 and 6, the pair of mount electrodes 12 and 13 is formed on the outer surface including a main surface and a side surface of the base portion 5 and is electrically connected to the pair of excitation electrodes 10 and 11 through lead-out electrodes 16, respectively. Accordingly, a voltage is applied to the pair of excitation electrodes 10 and 11 through the mount electrodes 12 and 13, respectively.

In addition, the excitation electrodes 10 and 11, the mount electrodes 12 and 13, and the lead-out electrode 16 are laminated films of chromium (Cr) and gold (Au), for example. Specifically, they are obtained by forming a chromium film, which has good adhesion to crystal, as a base and then forming a thin gold film on the surface. However, they are not limited to the above case. For example, a thin gold film may be further laminated on the surface of a laminated film made of chromium and Nichrome (NiCr), or a single film made of chromium, nickel, aluminum (Al), or titanium (Ti), may also be adopted.

In addition, a weight metal film 17 (configured to include a rough adjustment film 17a and a fine adjustment film 17b) for adjusting (frequency adjustment) the vibrating states of the pair of vibrating arms 3 and 4 to vibrate within a predetermined frequency range is formed at the distal ends of the pair of vibrating arms 3 and 4. By performing frequency adjustment using the weight metal film 17, the frequency of the pair of the vibrating arms 3 and 4 can be set to fall within the nominal frequency range of the device.

As shown in FIGS. 3 and 4, the piezoelectric vibrating reed 1 configured in this way is bump-bonded onto the lead-out electrodes 62 and 63, which are formed on the inner end surface of the base board 51, using a bump B made of gold or the like. More specifically, one excitation electrode 11 of the piezoelectric vibrating reed 1 is bump-bonded onto one lead-out electrode 62 through one mount electrode 12 and the bump B, and the other excitation electrode 10 is bump-bonded onto the other lead-out electrode 63 through the mount electrode 13 and the bump B. As a result, the piezoelectric vibrating reed 1 is supported in a state floated from the inner end surface of the base board 51, and the mount electrodes 12 and 13 and the lead-out electrodes 62 and 63 are electrically connected to each other, respectively.

Moreover, when operating the piezoelectric vibrating reed 1, a predetermined driving voltage is applied between the pair of excitation electrodes 10 and 11 so that a current flows through the pair of excitation electrodes 10 and 11. As a result, the pair of vibrating arms 3 and 4 can vibrate at a predetermined frequency in a direction of moving closer to or away from each other. In addition, this vibration can be used as a time source, a control signal timing source, a reference signal source, and the like.

(Method of Manufacturing a Piezoelectric Vibrator)

Figure 8:
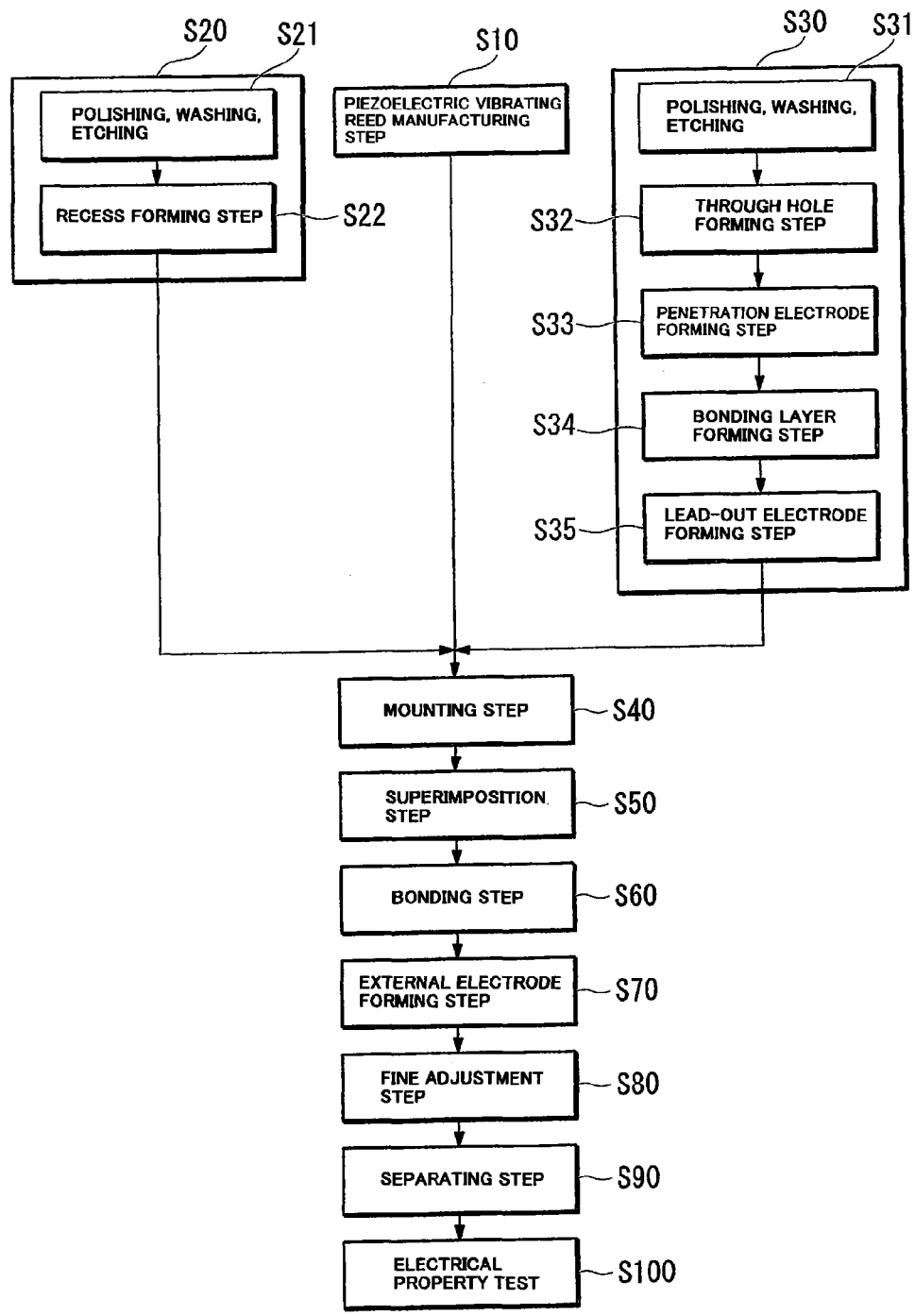
FIG. 8 is a flow chart showing the flow when manufacturing the piezoelectric vibrator shown in FIG. 1.
Figure 9:
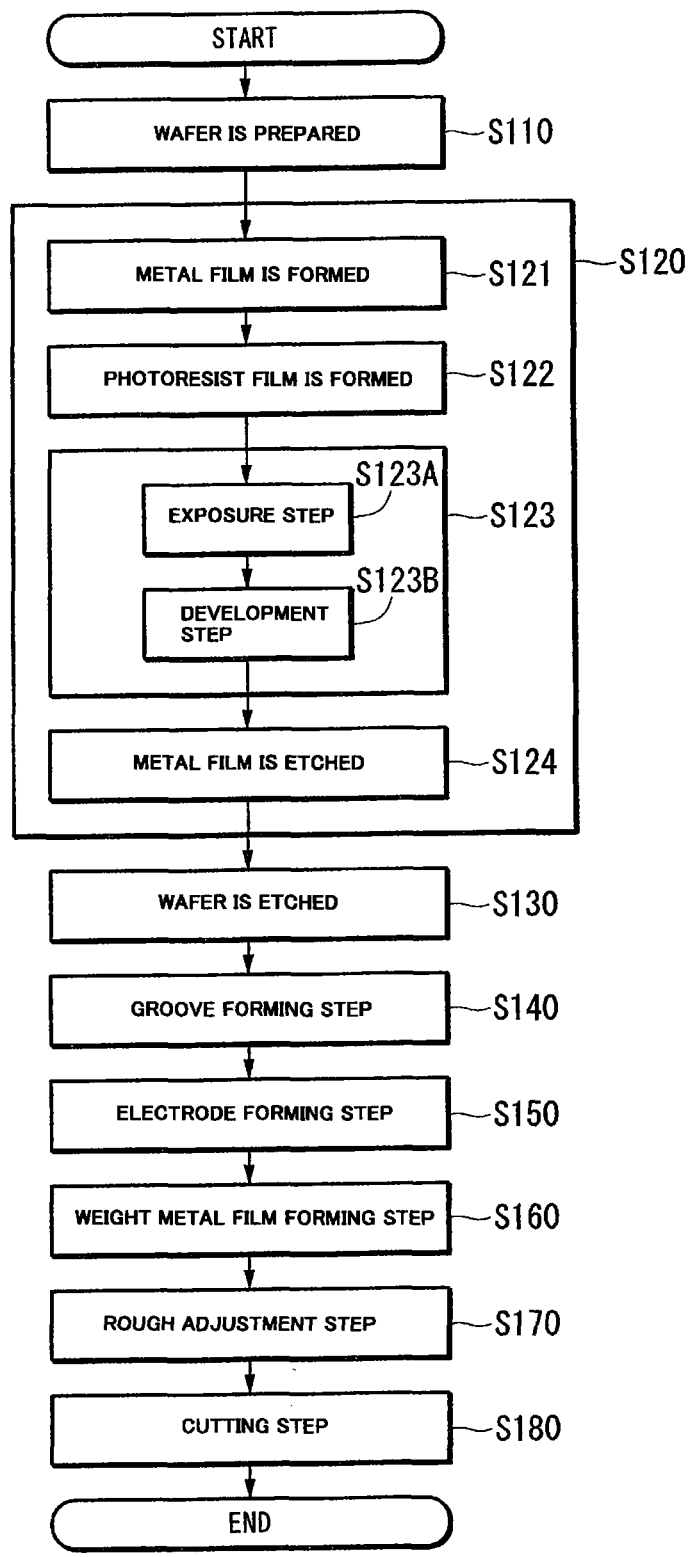
FIG. 9 is a flow chart showing the flow when manufacturing a piezoelectric vibrating reed.

Next, a method of manufacturing the above piezoelectric vibrator will be described. In the following explanation, a case of manufacturing a plurality of piezoelectric vibrating reeds from a wafer made of crystal will be exemplified. FIG. 8 is a flow chart showing a method of manufacturing a piezoelectric vibrator, and FIG. 9 is a flow chart showing a process of manufacturing a piezoelectric vibrating reed. In addition, FIGS. 10 to 23 are process views showing a method of manufacturing a piezoelectric vibrator.

(Process of Manufacturing a Piezoelectric Vibrating Reed)

Figure 10:
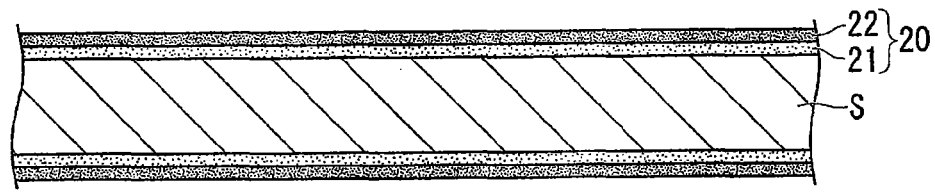
FIG. 10 is a process view showing a method of manufacturing a piezoelectric vibrating reed and is also a sectional view of a wafer.

First, as shown in FIG. 8, a piezoelectric vibrating reed manufacturing step (S10) is performed to manufacture the piezoelectric vibrating reed 1 shown in FIGS. 5 to 7. Specifically, as shown in FIGS. 9 and 10, a Lambert ore made of crystal is sliced at a predetermined angle to form a wafer S with a fixed thickness. Then, the wafer S is rubbed for rough processing, and the affected layer is removed by etching. Then, the wafer S is subjected to mirror processing, such as polishing, to make the wafer have a predetermined thickness (S110).

Then, an outer pattern 23 (refer to FIG. 17) for patterning the outer shapes of the plurality of piezoelectric vibrating reeds 1 from the wafer S is formed (S120). Hereinafter, this step will be specifically described.

First, as shown in FIG. 10, the polished wafer S is prepared, and then a metal film (object to be processed) 20 is formed on both sides of the wafer S (S121). This metal film 20 is a laminated film of a base film 21 formed of chromium and a protective film 22 formed of gold, for example. Each of the base film 21 and the protective film 22 is formed by a sputtering method, a vacuum deposition method, or the like.

Figure 11:
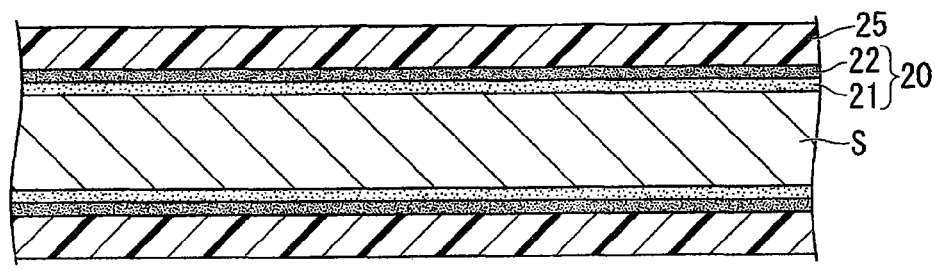
FIG. 11 is a process view showing the method of manufacturing a piezoelectric vibrating reed and is also a sectional view of a wafer.

Then, as shown by FIG. 11, a photoresist film (mask material) 25 is formed on the metal film 20 (S122). Specifically, a resist material is first coated on the metal film 20 by a spin coat method or the like. Moreover, as a resist material used in the present embodiment, a rubber based negative resist having cyclized rubber (for example, cyclized isoprene) as a main component is preferably used. The rubber based negative resist is obtained by dissolving cyclized rubber in an organic solvent, adding a bisazide photosensitizing agent, and removing impurities by filtering to be refined. Then, the organic solvent is evaporated by prebaking the resist material after coating the resist material. Thus, the photoresist film 25 is formed. Moreover, it is preferable that the prebaking is performed at 120° C. to 130° C. when the prebaking is performed in a hot plate and at 80° C. to 90° C. when the prebaking is performed in an oven.

Figure 12:
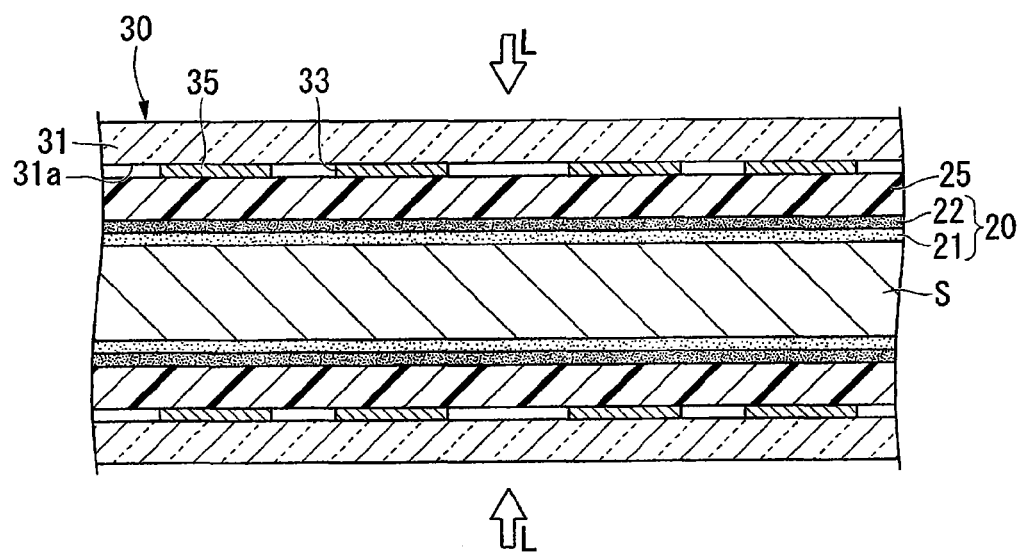
FIG. 12 is a process view showing the method of manufacturing a piezoelectric vibrating reed and is also a sectional view of a wafer.
Figure 15:
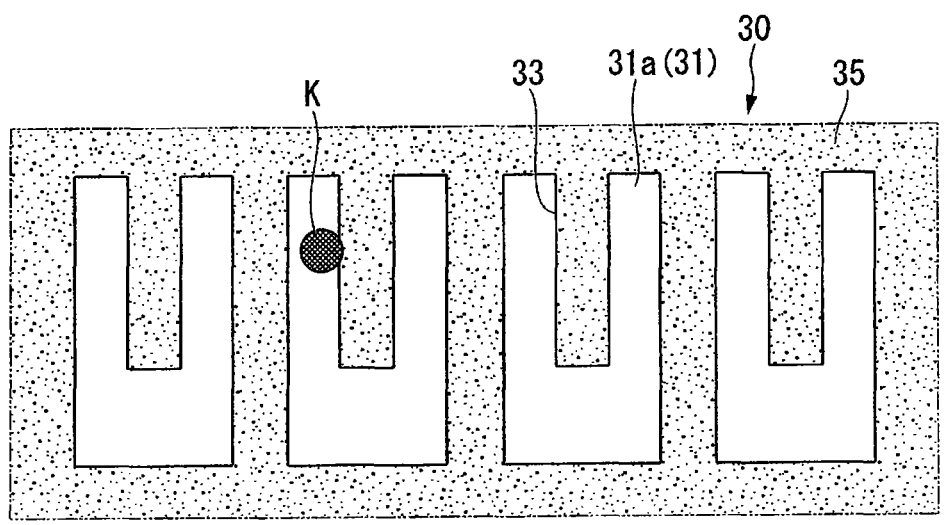
FIG. 15 is a process view showing the method of manufacturing a piezoelectric vibrating reed and is also a plan view of a photomask.

Here, the photoresist film 25 is patterned into a desired resist pattern 26 (refer to FIG. 13) using a photolithographic technique (S123: mask material pattern forming step). Specifically, as shown in FIGS. 12 and 15, a photomask 30 is set on the photoresist film 25. The photomask 30 is obtained by forming a light shielding film pattern 35 with a light blocking property, such as chromium, on a main surface 31a of a substrate 31 with optical transparency, such as glass. The light shielding film pattern 35 is for patterning the photoresist film 25 and is formed in a region excluding a region, which is equivalent to the outer shape of the piezoelectric vibrating reed 1, on the main surface 31a of the substrate 31. That is, a plurality of openings where the light shielding film pattern 35 is not formed are formed in the region, which is equivalent to the outer shape of the piezoelectric vibrating reed 1, on the main surface 31a of the substrate 31, and these openings become an outer shape equivalent region 33 having the outer shape of the piezoelectric vibrating reed 1.

Then, contact exposure of the photoresist film 25 is performed using the photomask 30 formed as described above (S123A). Specifically, the photomask 30 is first set in a state where the surface of the photomask 30 facing the main surface 31a side is made to face the photoresist film 25. In this case, the photomask 30 and the photoresist film 25 are set to be in close contact with each other in a state where positioning between the wafer S and the photomask 30 is completed.

As described above, in the present embodiment, the contact exposure is adopted in the exposure step (S123A) in which exposure is performed in a state where the photomask 30 and the photoresist film 25 are in close contact with each other. In the case where the photoresist film 25 is patterned by contact exposure, a foreign matter may enter between the photomask 30 and the photoresist film 25. As a result, as shown in FIG. 15, there is a possibility that damage K, such as a crack, will occur in the outer shape equivalent region 33 (substrate 31) of the photomask 30. In a portion corresponding to the damage K, the transmittance of light at the time of exposure is decreased. Accordingly, the photoresist film 25 of the region equivalent to the damage K is also affected by the damage K. That is, the same damage as in the outer shape equivalent region 33 is also transferred to the metal film 20 exposed through the outer shape equivalent region 33. As a result, at the time of subsequent patterning of the wafer S, the wafer S is abnormally etched. In this case, there is a problem that crystal defect occurs since forming the piezoelectric vibrating reed 1 in the desired outer shape is not possible.

For this reason, in the present embodiment, mask inspection for determining whether or not there is the damage K in the outer shape equivalent region 33 of the photomask 30 is performed before the step of forming the resist pattern 26 (S123). In addition, when the damage K is not found in the outer shape equivalent region 33, the same photomask 30 is used in the exposure step (S123A).

Figure 16:
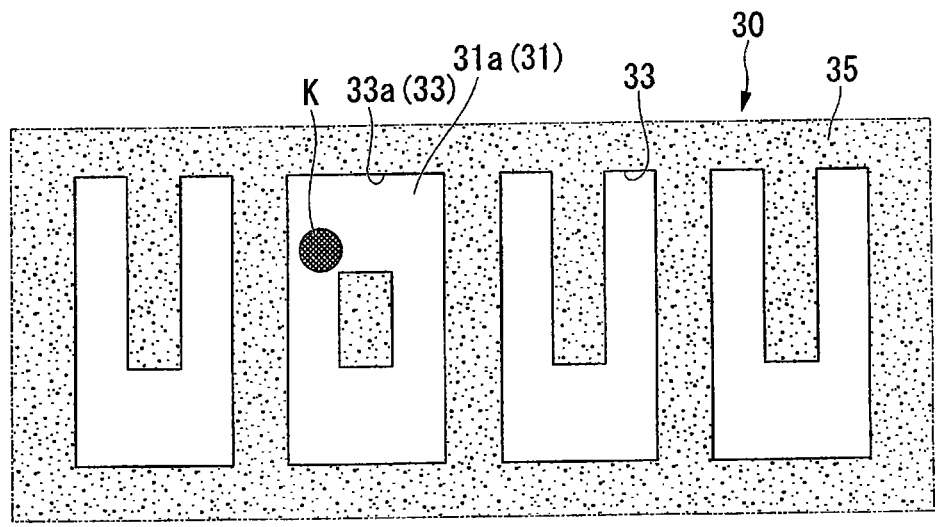
FIG. 16 is a process view showing the method of manufacturing a piezoelectric vibrating reed and is also a plan view of a photomask.

On the other hand, when the damage K is found in the outer shape equivalent region 33 (substrate 31) of the photomask 30 in the mask inspection, the outer shape of the outer shape equivalent region 33 with the damage K is changed by removing the light shielding film pattern 35 of the photomask 30 with a laser (photomask treatment step). Specifically, as shown in FIG. 16, the photomask 30 is conveyed to a laser device (not shown), and the light shielding film pattern 35 is removed by a laser so that regions equivalent to the vibrating arms 3 and 4 (refer to FIG. 5) in the outer shape equivalent region 33 are connected. As a result, the outer shape equivalent region 33 with the damage K is formed in a defective outer shape equivalent region 33a which has an approximately rectangular frame shape in plan view. That is, before performing the exposure step (S123A), the outer shape equivalent region 33 with the damage K is set as the defective outer shape equivalent region 33a in advance so that the outer shapes of the non-defective outer shape equivalent region 33 and the defective outer shape equivalent region 33a can be distinguished from each other in a positive way. As a laser in the present embodiment, for example, a YAG laser with a wavelength of 1064 nm is preferably used.

Then, in this state, contact exposure of the photoresist film 25 is performed using the photomask 30 as shown in FIG. 12. Specifically, if an ultraviolet ray L for exposure is irradiated from the both surface sides of the wafer S, the ultraviolet ray L is transmitted through the photomask 30 to expose the photoresist film 25. In this case, only the ultraviolet ray L, which is incident on a region of the photomask 30 where the outer shape equivalent region 33 (and the defective outer shape equivalent region 33a) is formed, is transmitted through the substrate 31 to expose the photoresist film 25. Then, only the photoresist film 25 of the region to which the ultraviolet ray L for exposure has been irradiated is cured. After the exposure ends, the photomask 30 is removed. In addition, the removed photomask 30 is washed in another step and is repeatedly used in the exposure step of the wafer S conveyed next. In the present embodiment, incidence of light between the photoresist film 25 and the photomask 30 can be reduced by adopting the contact exposure in the exposure step of the photoresist film 25 (S123A). As a result, since the resolution at the time of exposure is improved, the resist pattern 26 can be formed with high dimensional accuracy.

Figure 13:
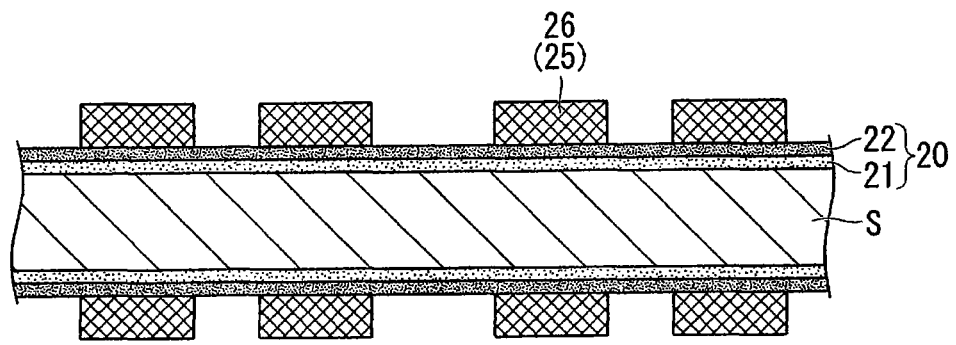
FIG. 13 is a process view showing the method of manufacturing a piezoelectric vibrating reed and is also a sectional view of a wafer.

Then, as shown in FIG. 13, development of the photoresist film 25 is performed after removing the photomask 30 (S123B). Specifically, the wafer S is immersed in a developing solution so that only the photoresist film 25 of the region, to which the ultraviolet ray L for exposure is not irradiated, is selectively removed. That is, the plurality of resist patterns 26 in a state where the photoresist film 25 remains in the outer shape of the piezoelectric vibrating reed 1 are formed on the metal film 20 after development. In this case, the photoresist film 25, which is exposed by the ultraviolet ray L transmitted through the non-defective outer shape equivalent region 33, is formed as the tuning fork type resist pattern 26 according to the outer shape of the piezoelectric vibrating reed 1. On the other hand, the photoresist film 25, which is exposed by the ultraviolet ray L transmitted through the defective outer shape equivalent region 33a, is formed as a rectangular frame-shaped defective resist pattern (not shown).

Figure 14:
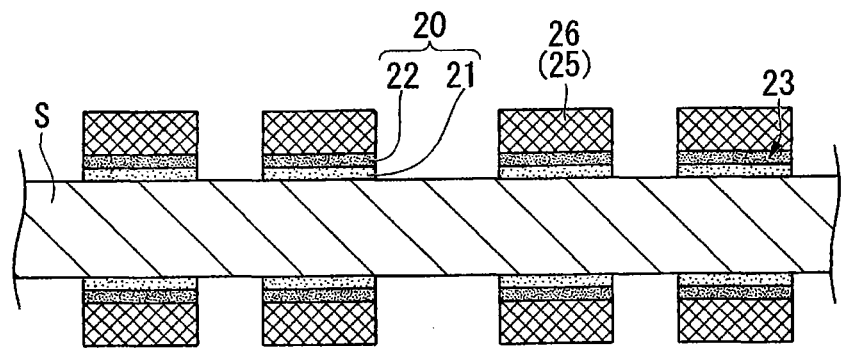
FIG. 14 is a process view showing the method of manufacturing a piezoelectric vibrating reed and is also a sectional view of a wafer.
Figure 17:
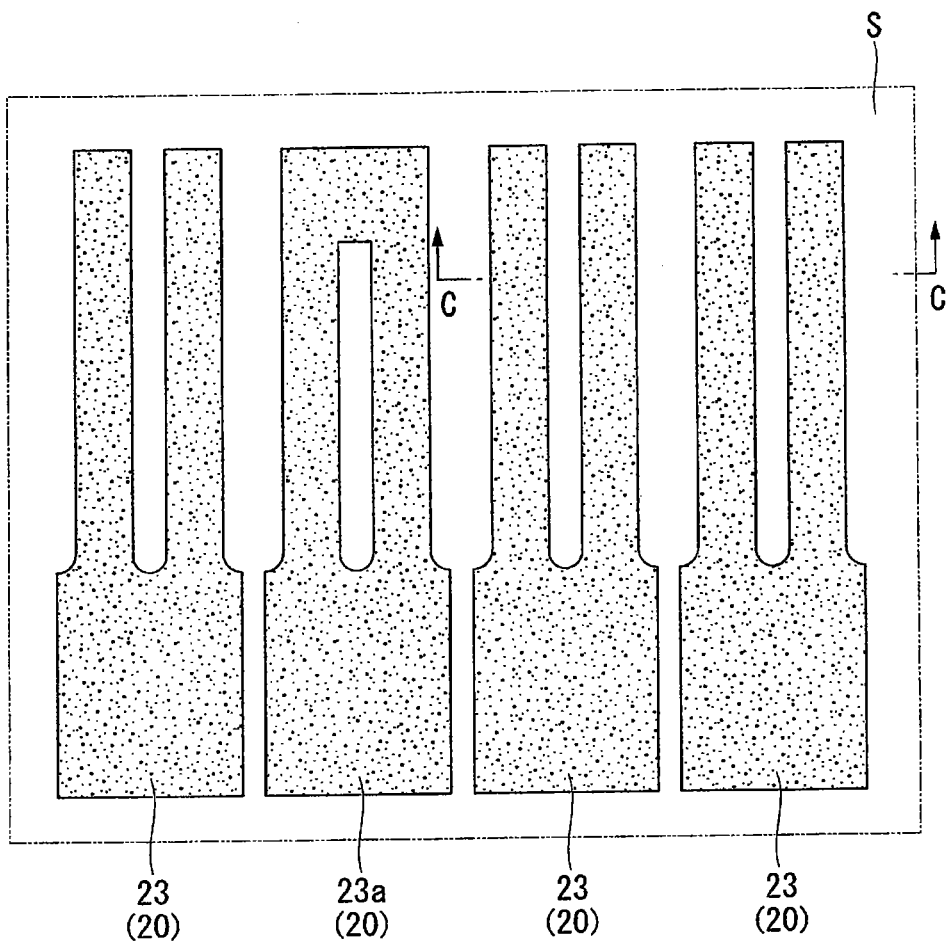
FIG. 17 is a process view showing a method of manufacturing a piezoelectric vibrating reed and is also a plan view showing a wafer in a state where an outer pattern is formed on the wafer.
Figure 18:
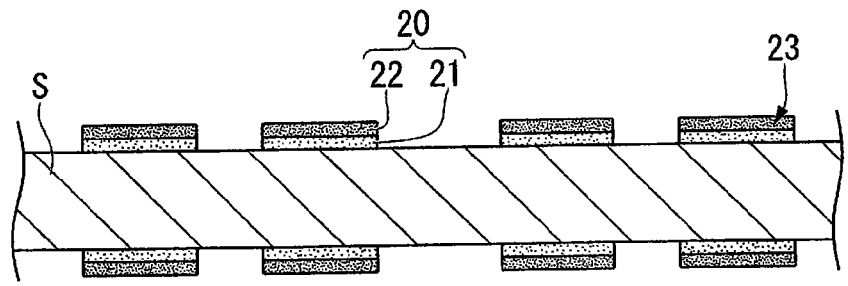
FIG. 18 is a process view showing the method of manufacturing a piezoelectric vibrating reed and is also a sectional view taken along the line C-C in FIG. 17.

Then, as shown in FIG. 14, etching processing (for example, wet etching) is performed by using the resist pattern 26 as a mask so that the metal film 20, which is not masked (metal film 20 other than the region where the piezoelectric vibrating reed 1 is formed), is selectively removed (S124: outer pattern forming step). Then, as shown in FIGS. 17 and 18, the resist pattern 26 of the photoresist film 25 is removed after etching processing. As a result, the metal film 20 patterned by the non-defective resist pattern 26 can be formed as the outer pattern 23 which has the same shape as the outer shape of the piezoelectric vibrating reed 1. That is, the metal film 20 can be patterned according to the outer shapes of the pair of vibrating arms 3 and 4 and the base portion 5. On the other hand, the metal film 20 patterned by the defective resist pattern is formed as a rectangular frame-shaped defective outer pattern 23a (refer to FIG. 17). In this case, the plurality of piezoelectric vibrating reeds 1 formed on the wafer S is collectively patterned.

Figure 19:
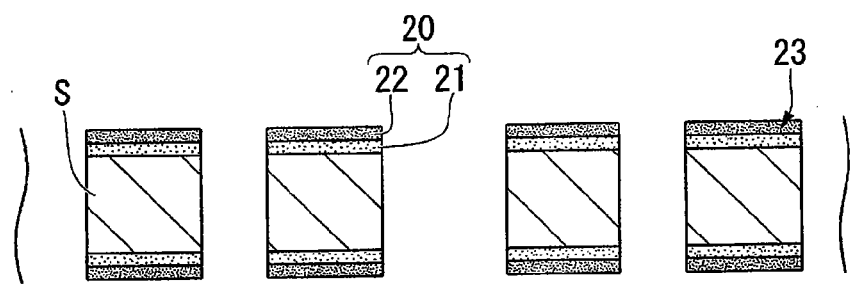
FIG. 19 is a process view showing the method of manufacturing a piezoelectric vibrating reed and is also a sectional view taken along the line C-C in FIG. 17.

Then, as shown in FIG. 19, etching processing is performed from both surfaces of the wafer S using the patterned outer pattern 23 (and the defective outer pattern 23a) as a mask (S130). Accordingly, a region which is not masked by the outer pattern 23 (and the defective outer pattern 23a) is selectively removed. As a result, the wafer S patterned by the outer pattern 23 can be formed in the outer shape of the tuning fork type piezoelectric plate 2 described above, as shown in FIG. 22. In addition, the outer shape of the piezoelectric plate 2 can be formed as a desired shape with high precision by performing etching from both the surfaces of the wafer S like the present embodiment.

Figure 22:
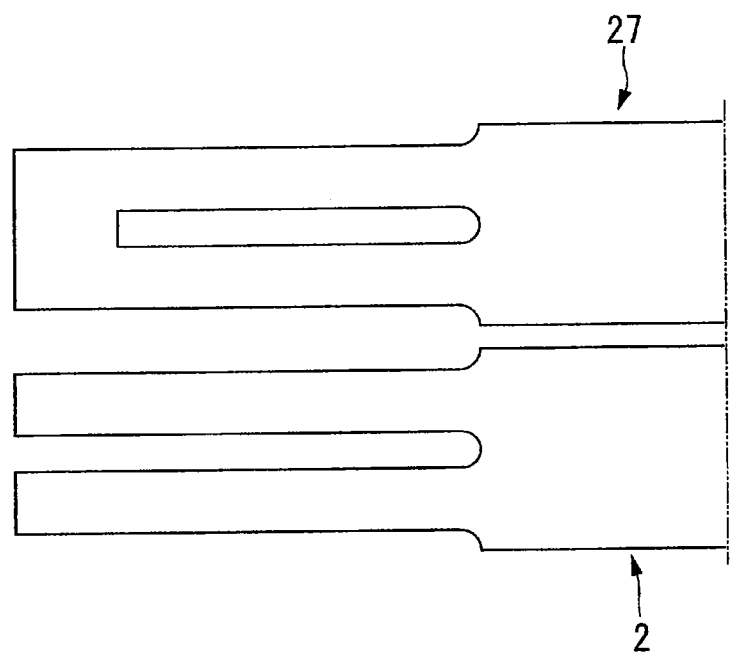
FIG. 22 is a process view showing the method of manufacturing a piezoelectric vibrating reed and is also a plan view of a defective piezoelectric plate.

On the other hand, the wafer S patterned by the defective outer pattern 23a is formed as a rectangular frame-shaped defective piezoelectric plate 27, as shown in FIG. 22. That is, by patterning the wafer S using the defective outer pattern 23a as a mask, the approximately rectangular frame-shaped defective piezoelectric plate 27 in which the vibrating arms 3 and 4 are connected to each other is formed on the wafer S corresponding to the defective outer pattern 23a. In addition, the plurality of piezoelectric plates 2 and defective piezoelectric plates 27 are connected to the wafer S through connecting portions (not shown) until a cutting step is performed later. That is, since respective steps are collectively performed on the wafer S in a state where the non-defective piezoelectric plate 2 and the defective piezoelectric plate 27 are connected to each other, the same processing as for the piezoelectric plate 2 is performed for the defective piezoelectric plate 27 in subsequent steps.

Figure 20:
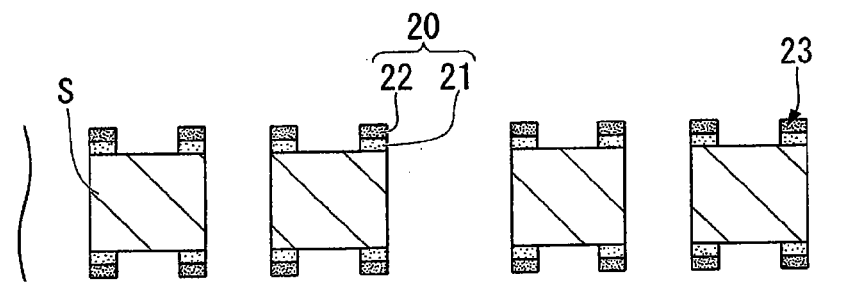
FIG. 20 is a process view showing the method of manufacturing a piezoelectric vibrating reed and is also a sectional view taken along the line C-C in FIG. 17.

Then, a groove forming step of forming the grooves 6 on the pair of main surfaces of the vibrating arms 3 and 4 is performed (S140). Specifically, a photoresist film (not shown) is formed on the outer pattern 23 (metal film 20). Then, using a photolithographic technique, the photoresist film is patterned such that the region of the groove 6 is empty. Then, etching processing is performed using the patterned photoresist film as a mask in order to selectively remove the outer pattern 23. Then, the photoresist film is removed and accordingly, the already patterned outer pattern 23 can be further patterned in a state where the region of the groove 6 is empty, as shown in FIG. 20.

Figure 21:
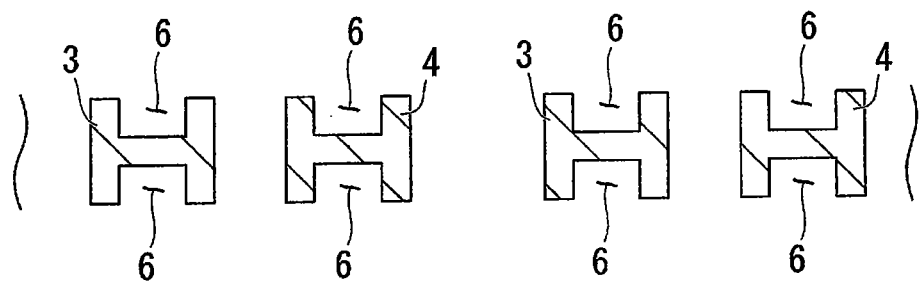
FIG. 21 is a process view showing the method of manufacturing a piezoelectric vibrating reed and is also a sectional view taken along the line C-C in FIG. 17.

Then, the wafer S is etched using the outer pattern 23, which was patterned again, as a mask and then the outer pattern 23 which was used as a mask is removed. As a result, as shown in FIG. 21, the grooves 6 can be formed on both the main surfaces of the pair of vibrating arms 3 and 4.

Then, an electrode forming step of forming the excitation electrodes 10 and 11, the lead-out electrode 16, and the mount electrodes 12 and 13 by patterning an electrode film on the outer surface of the plurality of piezoelectric plates 2 (S150) is performed. Specifically, an electrode film is formed on the outer surface of the piezoelectric plate 2 (and the defective piezoelectric plate 27), in which the groove 6 is formed, using a vacuum deposition method, a sputtering method, or the like. Then, a photoresist film is formed by spray coat or the like, and then exposure and development are performed using a photolithographic technique in order to pattern the photoresist film. Then, the electrode film is patterned by performing etching using the remaining photoresist film as a mask. Then, the photoresist film which was used as a mask is removed. Thus, the electrode described above can be formed.

Then, after the electrode forming step ends, the weight metal film 17 (for example, silver or gold) configured to include the rough adjustment film 17a and the fine adjustment film 17b for frequency control is formed at the distal ends of the pair of vibrating arms 3 and 4 (S160). Then, a rough adjustment step of adjusting the resonance frequency roughly is performed for all the vibrating arms 3 and 4 formed in the wafer S (S170). This is performed by changing the weight by irradiating a laser beam onto the rough adjustment film 17a of the weight metal film 17 to evaporate a part of the rough adjustment film 17a. In addition, fine adjustment for adjusting the resonance frequency more accurately is performed after mounting the piezoelectric vibrating reed 1 in a package.

Finally, a cutting step of separating the plurality of piezoelectric plates 2 (and the defective piezoelectric plates 27) from the wafer S to become individual pieces by cutting the connecting portion which connects the wafer S and the piezoelectric plate 2 to each other (S180). As a result, the plurality of tuning fork type piezoelectric vibrating reeds 1 can be simultaneously manufactured from one wafer S.

At this point of time, the manufacturing process of the piezoelectric vibrating reed 1 ends and the piezoelectric vibrating reed 1 shown in FIG. 5 can be obtained.

Figure 23:
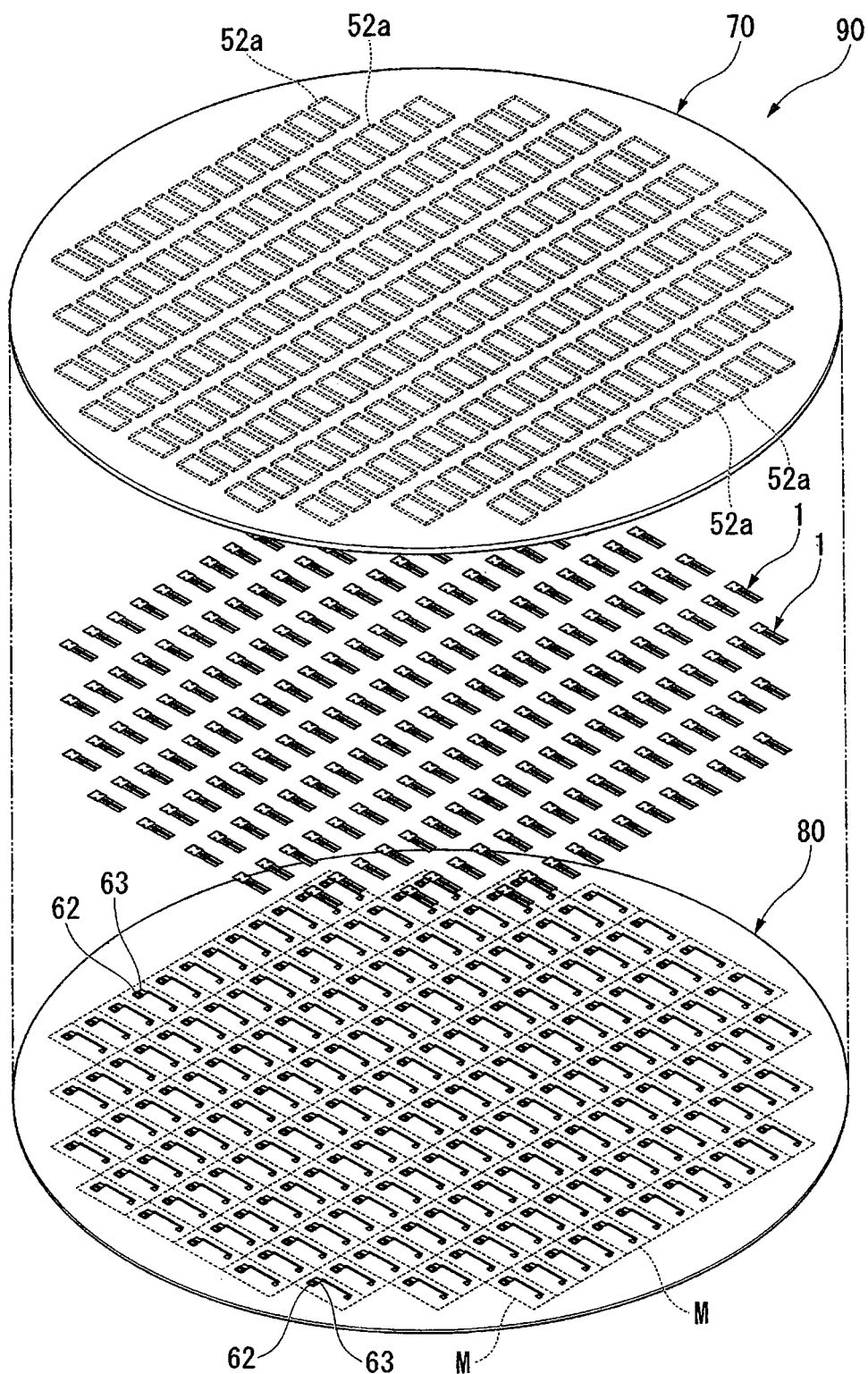
FIG. 23 is a process view showing a method of manufacturing a piezoelectric vibrator and is also an exploded perspective view of a wafer bonding body in which a wafer for base boards and a wafer for lid boards are anodically bonded to each other in a state where a piezoelectric vibrating reed is housed in a cavity.

Then, as shown in FIGS. 8 and 23, a first wafer manufacturing step in which a wafer 70 for lid boards, which will become the lid boards 52 later, is processed to a state immediately before performing anodic bonding (S20) is performed. First, soda lime glass is polished up to a predetermined thickness and washed and then the disk-shaped wafer 70 for lid boards, from which an affected layer located at the outermost surface was removed by etching or the like, is formed (S21). Then, a recess forming step of forming the plurality of recesses 52a for cavity C in a matrix is performed on the bonding surface of the wafer 70 for lid boards (S22). At this point of time, the first wafer manufacturing step (S20) ends.

Then, simultaneously with the first wafer manufacturing step (S20) or at a timing before or after the first wafer manufacturing step (S20), a second wafer manufacturing step in which a wafer 80 for base boards, which will become the base boards 51 later, is processed to a state immediately before performing anodic bonding (S30) is performed. First, soda lime glass is polished up to a predetermined thickness and washed and then the disk-shaped wafer 80 for base boards, from which an affected layer located at the outermost surface was removed by etching or the like, is formed (S31).

Then, a through hole forming step (S32) of forming the pair of through holes 57 and 58, which pass through the wafer 80 for base boards, in a plural number is performed. Specifically, the pair of through holes 57 and 58 is formed in a plural number so as to be settled in the recess 52a, which is formed in the wafer 70 for lid boards, when both the wafers 70 and 80 are superimposed later. In addition, the pair of through holes 57 and 58 is formed such that one through hole 57 is located at the base portion 5 side of the piezoelectric vibrating reed 1, which is mounted later, and the other through hole 58 is located at the distal end side of the vibrating arm 4. In addition, it is preferable that the through holes 57 and 58 are formed by a sand blasting method or a pressing method using a jig.

Then, a penetration electrode forming step (S33) of forming the penetration electrodes 55 and 56 in the through holes 57 and 58, which were formed in the through hole forming step (S32), is performed. As a result, the penetration electrodes 55 and 56 are held in the through holes 57 and 58 in a state where the core portion 66 is level with both surfaces (upper and lower surfaces in FIG. 3) of the wafer 80 for base boards. In this way, the penetration electrodes 55 and 56 can be formed.

Then, a bonding film forming step (S34) of forming a bonding film 61 (refer to FIG. 3) by patterning a conductive material on the upper surface of the wafer 80 for base boards, and a lead-out electrode forming step of forming the plurality of lead-out electrodes 62 and 63 electrically connected to the pair of penetration electrodes 55 and 56, respectively, is performed (S35).

By performing this step, one penetration electrode 55 and one lead-out electrode 62 are electrically connected to each other, and the other penetration electrode 56 and the other lead-out electrode 63 are also electrically connected to each other. At this point of time, the second wafer manufacturing step (S30) ends.

In the present embodiment, the process order is set such that the lead-out electrode forming step (S35) is performed after the bonding film forming step (S34). However, the bonding film forming step (S34) may be performed after the lead-out electrode forming step (S35) contrary to the process order in the present embodiment, or both the steps may be performed simultaneously. Even if any process order is adopted, the same operations and effects can be obtained. Thus, the process order may be appropriately changed when necessary.

Then, a mounting step of performing bump bonding of the plurality of manufactured piezoelectric vibrating reeds 1 onto the upper surface of the wafer 80 for base boards through the lead-out electrodes 62 and 63 is performed (S40). First, the bump B made of gold or the like is formed on each of the pair of lead-out electrodes 62 and 63. Then, the base portion 5 of the piezoelectric vibrating reed 1 is placed on the bump B and then the piezoelectric vibrating reed 1 is pressed against the bump B while heating the bump B at predetermined temperature. As a result, the piezoelectric vibrating reed 1 is mechanically supported by the bump B and is also electrically connected to the mount electrodes 12 and 13 and the lead-out electrodes 62 and 63. Accordingly, at this point of time, the pair of excitation electrodes 10 and 11 of the piezoelectric vibrating reed 1 is electrically connected to the pair of penetration electrodes 55 and 56, respectively. In particular, since bump bonding is performed for the piezoelectric vibrating reed 1, the piezoelectric vibrating reed 1 is supported in a state floated from the upper surface of the wafer 80 for base boards.

After the mounting of the piezoelectric vibrating reed 1 ends, a superimposition step of superimposing the wafer 70 for lid boards on the wafer 80 for base boards is performed (S50). Specifically, both the wafers 70 and 80 are aligned at the correct positions using reference marks (not shown) as an index. As a result, the mounted piezoelectric vibrating reed 1 is housed in the recess 52a formed in the wafer 70 for lid boards and the cavity C surrounded by both the wafers 70 and 80.

After the superimposition step (S50), the two superimposed wafers 70 and 80 are put into an anodic bonding device (not shown), and a bonding step of performing anodic bonding by applying a predetermined voltage while heating the wafers 70 and 80 up to predetermined temperature (bonding temperature) is performed (S60). Specifically, a predetermined voltage is applied between the bonding film 61 and the wafer 70 for lid boards. Then, electrochemical reaction occurs on the interface between the bonding film 61 and the wafer 70 for lid boards, and both the bonding film 61 and the wafer 70 for lid boards come in close contact with each other to be anodically bonded. As a result, since the piezoelectric vibrating reed 1 can be sealed in the cavity C, it is possible to acquire a wafer body 90 shown in FIG. 23 in which the wafer 80 for base boards and the wafer 70 for lid boards are bonded to each other. Moreover, in FIG. 23, in order to improve the viewability of the diagram, a state where the wafer body 90 is disassembled is shown and illustration of the wafer 80 for base boards to the bonding film 61 is omitted.

Then, after the anodic bonding described above ends, an external electrode forming step of forming the pair of external electrodes 53 and 54 electrically connected to the pair of penetration electrodes 55 and 56, respectively, in a plural number by patterning a conductive material on the lower surface of the wafer 80 for base boards is performed (S70). Through this step, the piezoelectric vibrating reed 1 which is sealed in the cavity C can be operated using the external electrodes 53 and 54.

Then, a fine adjustment step of setting the frequency of each piezoelectric vibrator 50, which is sealed in the cavity C, to fall within a predetermined range by fine adjustment is performed (S80). Specifically, a voltage is applied to the external electrodes 53 and 54 in order to vibrate the piezoelectric vibrating reed 1. Then, a laser beam is irradiated from the outside through the wafer 80 for base boards while measuring the frequency, so that the fine adjustment film 17b of the weight metal film 17 is evaporated. As a result, since the weight of the pair of vibrating arms 3 and 4 at the distal end side thereof changes, the frequency of the piezoelectric vibrating reed 1 can be finely tuned to fall within a predetermined range of a nominal frequency.

After the fine adjustment of a frequency ends, a separating step of making the bonded wafer body 90 into pieces by cutting it along a cutting line M shown in FIG. 23 (S90) is performed. As a result, it is possible to simultaneously manufacture the plurality of surface mount type piezoelectric vibrators 50 shown in FIG. 1 in which the piezoelectric vibrating reed 1 is sealed in the cavity C formed between the base board 51 and the lid board 52 that are anodically bonded to each other.

In the present embodiment, however, not only the non-defective piezoelectric vibrating reed 1 but also a defective piezoelectric vibrating reed formed of the defective piezoelectric plate 27 may be housed in the cavity C because the non-defective piezoelectric vibrating reed 1 and the defective piezoelectric vibrating reed formed of the defective piezoelectric plate 27 are processed through the same steps.

Here, electrical properties of the piezoelectric vibrator 50 are tested to sort out the non-defective piezoelectric vibrator 50, in which the non-defective piezoelectric vibrating reed 1 is housed, from a defective piezoelectric vibrator, in which a defective piezoelectric vibrating reed is housed (S100). Specifically, a voltage is applied to the external electrodes 53 and 54 to vibrate the piezoelectric vibrating reed 1. In addition, resonance frequency, resonance resistance value, drive level characteristics (exciting power dependency of resonance frequency and resonance resistance value), and the like of the piezoelectric vibrating reed 1 are checked by measurement. Moreover, an insulation resistance characteristic and the like are checked together.

Moreover, when the values of such measured parameters of a piezoelectric vibrating reed are out of desired ranges or when the operation of the piezoelectric vibrating reed is not possible, the piezoelectric vibrating reed is excluded as a defective product. In this case, the defective piezoelectric plate 27 (refer to FIG. 22), in which the vibrating arms 3 and 4 are connected to each other, does not vibrate. Therefore, it is possible to reliably sort out a defective piezoelectric vibrating reed from the non-defective piezoelectric vibrating reed 1 by excluding a piezoelectric vibrating reed which does not vibrate. Finally, visual inspection of the piezoelectric vibrator 50 is performed to finally check the dimension, quality, and the like. Thus, the manufacturing of the piezoelectric vibrator 50 ends.

Thus, in the present embodiment, when the damage K is found in the outer shape equivalent region 33 prior to the photomask treatment step (S123), the outer shape of the outer shape equivalent region 33 with the damage K is changed by removing the light shielding film pattern 35 of the photomask 30 with a laser.

According to this configuration, since the exposure step is performed in a state where the outer shape of the outer shape equivalent region 33 including the damage K portion has been changed in advance when there is the damage K in the outer shape equivalent region 33 of the photomask 30, the photoresist film 25 patterned by the defective outer shape equivalent region 33*a* is formed as a defective resist pattern having a different shape from the resist pattern 26 patterned by the non-defective outer shape equivalent region 33. In this way, the outer shape of a piezoelectric plate (defective piezoelectric plate 27), which is formed on the wafer S equivalent to a defective resist pattern, and the outer shape of the piezoelectric plate 2, which is formed on the wafer S equivalent to the non-defective resist pattern 26, can be made to be different from each other in a positive way. Accordingly, in the electrical property test or the like in the final step, a clear difference of electrical properties occurs between a defective product and a non-defective product. As a result, only the non-defective piezoelectric vibrating reed 1 can be distributed since a defective product and a non-defective product can be correctly sorted out. Thus, it is possible to provide the reliable piezoelectric vibrating reed 1 excellent in the vibration characteristic.

Moreover, in the present embodiment, a defective piezoelectric vibrating reed in which the vibrating arms 3 and 4 are connected to each other is formed since the defective outer shape equivalent region 33*a* is formed such that the regions equivalent to the vibrating arms 3 and 4 are connected to each other. In this case, since the piezoelectric vibrating reed in which the vibrating arms 3 and 4 are connected to each other does not vibrate, a defective product and a non-defective product can be correctly sorted out in the electrical property test or the like.

(Oscillator)

Next, an oscillator according to another embodiment of the invention will be described with reference to FIG. 24.

Figure 24:
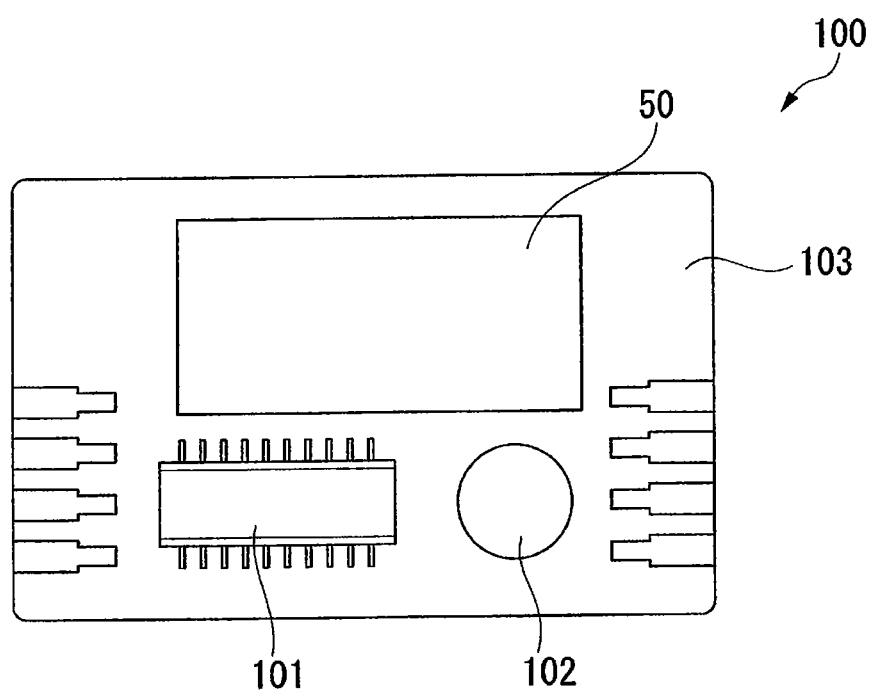
FIG. 24 is a view showing the configuration of a oscillator according to an embodiment of the invention.

In an oscillator 100 according to the present embodiment, the piezoelectric vibrator 50 is used as a vibrator electrically connected to an integrated circuit 101, as shown in FIG. 24. The oscillator 100 includes a substrate 103 on which an electronic component 102, such as a capacitor, is mounted. The integrated circuit 101 for an oscillator is mounted on the substrate 103, and the piezoelectric vibrator 50 is mounted near the integrated circuit 101. The electronic component 102, the integrated circuit 101, and the piezoelectric vibrator 50 are electrically connected to each other by a wiring pattern (not shown). In addition, each of the constituent components is molded with a resin (not shown).

In the oscillator 100 configured as described above, when a voltage is applied to the piezoelectric vibrator 50, the piezoelectric vibrating reed 1 in the piezoelectric vibrator 50 vibrates. This vibration is converted into an electrical signal due to the piezoelectric property of the piezoelectric vibrating reed 1 and is then input to the integrated circuit 101 as the electrical signal. The input electrical signal is subjected to various kinds of processing by the integrated circuit 101 and is then output as a frequency signal. In this way, the piezoelectric vibrator 50 functions as an oscillator.

Moreover, by selectively setting the configuration of the integrated circuit 101, for example, an RTC (real time clock) module, according to the demands, it is possible to add a function of controlling the operation date or time of the corresponding device or an external device or of providing the time or calendar in addition to a single functional oscillator for a timepiece.

As described above, since the oscillator 100 according to the present embodiment includes the high-quality piezoelectric vibrator 50, the oscillator 100 can also have high quality. In addition to this, it is possible to obtain a highly precise frequency signal which is stable over a long period of time.

(Electronic Apparatus)

Figure 25:
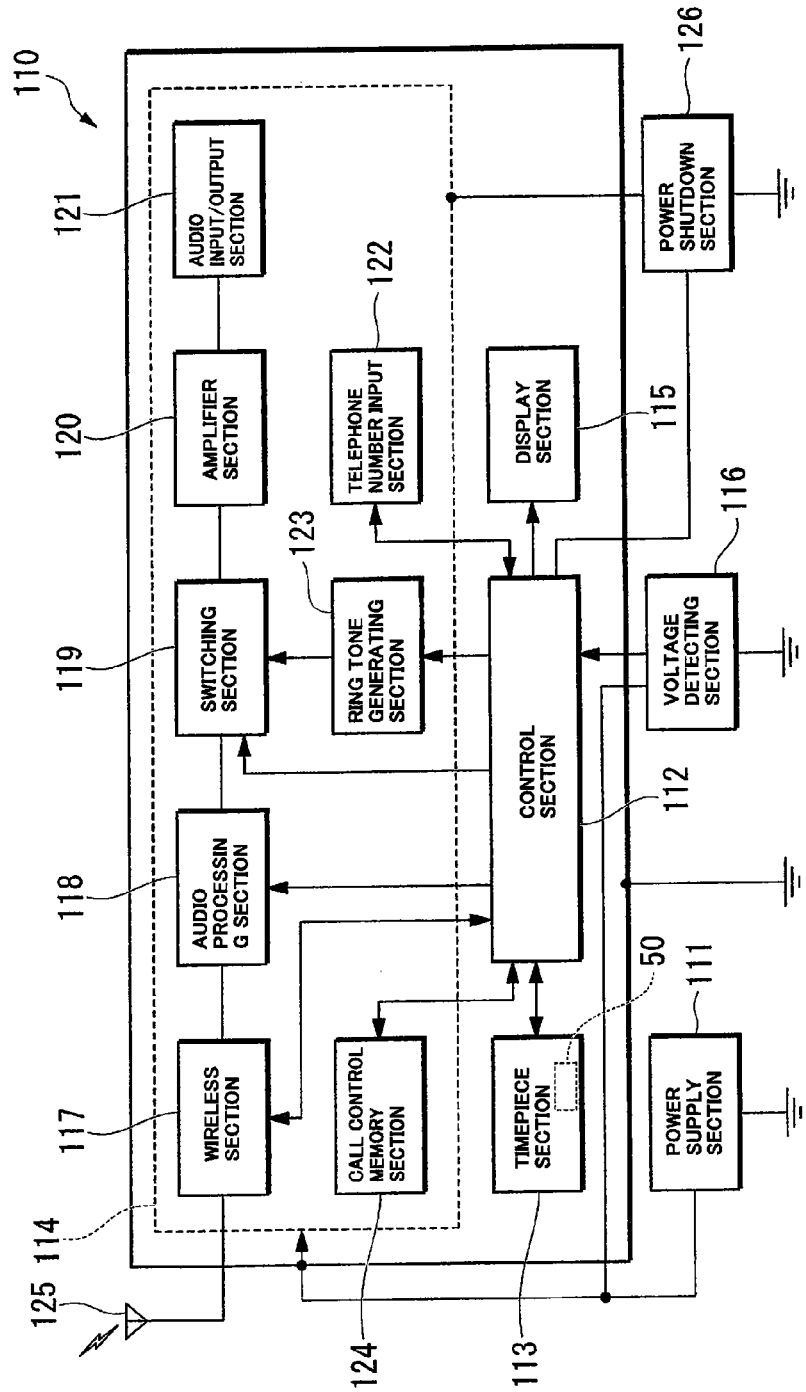
FIG. 25 is a view showing the configuration of an electronic apparatus according to an embodiment of the invention.

Next, an electronic apparatus according to another embodiment of the invention will be described with reference to FIG. 25. In addition, a portable information device 110 including the piezoelectric vibrator 50 will be described as an example of an electronic apparatus. The portable information device 110 according to the present embodiment is represented by a mobile phone, for example, and has been developed and improved from a wristwatch in the related art. The portable information device 110 is similar to a wristwatch in external appearance, and a liquid crystal display is disposed in a portion equivalent to a dial pad so that a current time and the like can be displayed on this screen. Moreover, when it is used as a communication apparatus, it is possible to remove it from the wrist and to perform the same communication as a mobile phone in the related art with a speaker and a microphone built in an inner portion of the band. However, the portable information device 110 is very small and light compared with a mobile phone in the related art.

Next, the configuration of the portable information device 110 according to the present embodiment will be described. As shown in FIG. 25, the portable information device 110 includes the piezoelectric vibrator 50 and a power supply section 111 for supplying power. The power supply section 111 is formed of a lithium secondary battery, for example. A control section 112 which performs various kinds of control, a timepiece section 113 which performs counting of time and the like, a communication section 114 which performs communication with the outside, a display section 115 which displays various kinds of information, and a voltage detecting section 116 which detects the voltage of each functional section are connected in parallel to the power supply section 111. In addition, the power supply section 111 supplies power to each functional section.

The control section 112 controls an operation of the entire system. For example, the control section 112 controls each functional section to transmit and receive the audio data or to measure or display a current time. In addition, the control section 112 includes a ROM in which a program is written in advance, a CPU which reads and executes a program written in the ROM, a RAM used as a work area of the CPU, and the like.

The timepiece section 113 includes an integrated circuit, which has an oscillation circuit, a register circuit, a counter circuit, and an interface circuit therein, and the piezoelectric vibrator 50. When a voltage is applied to the piezoelectric vibrator 50, the piezoelectric vibrating reed 1 vibrates, and this vibration is converted into an electrical signal due to the piezoelectric property of crystal and is then input to the oscillation circuit as the electrical signal. The output of the oscillation circuit is binarized to be counted by the register circuit and the counter circuit. Then, a signal is transmitted to or received from the control section 112 through the interface circuit, and current time, current date, calendar information, and the like are displayed on the display section 115.

The communication section 114 has the same function as a mobile phone in the related art, and includes a wireless section 117, an audio processing section 118, a switching section 119, an amplifier section 120, an audio input/output section 121, a telephone number input section 122, a ring tone generating section 123, and a call control memory section 124.

The wireless section 117 transmits/receives various kinds of data, such as audio data, to/from the base station through an antenna 125. The audio processing section 118 encodes and decodes an audio signal input from the wireless section 117 or the amplifier section 120. The amplifier section 120 amplifies a signal input from the audio processing section 118 or the audio input/output section 121 up to a predetermined level. The audio input/output section 121 is formed by a speaker, a microphone, and the like, and amplifies a ring tone or incoming sound louder or collects the sound.

In addition, the ring tone generating section 123 generates a ring tone in response to a call from the base station. The switching section 119 switches the amplifier section 120, which is connected to the audio processing section 118, to the ring tone generating section 123 only when a call arrives, so that the ring tone generated in the ring tone generating section 123 is output to the audio input/output section 121 through the amplifier section 120.

In addition, the call control memory section 124 stores a program related to incoming and outgoing call control for communications. Moreover, the telephone number input section 122 includes, for example, numeric keys from 0 to 9 and other keys. The user inputs a telephone number of a communication destination by pressing these numeric keys and the like.

The voltage detecting section 116 detects a voltage drop when a voltage, which is applied from the power supply section 111 to each functional section, such as the control section 112, drops below the predetermined value, and notifies the control section 112 of the detection. In this case, the predetermined voltage value is a value which is set beforehand as a lowest voltage necessary to operate the communication section 114 stably. For example, it is about 3 V. When the voltage drop is notified from the voltage detecting section 116, the control section 112 disables the operation of the wireless section 117, the audio processing section 118, the switching section 119, and the ring tone generating section 123. In particular, the operation of the wireless section 117 that consumes a large amount of power should be necessarily stopped. In addition, a message informing that the communication section 114 is not available due to insufficient battery power is displayed on the display section 115.

That is, it is possible to disable the operation of the communication section 114 and display the notice on the display section 115 by the voltage detecting section 116 and the control section 112. This message may be a character message. Or as a more intuitive indication, a cross mark (X) may be displayed on a telephone icon displayed at the top of the display screen of the display section 115.

In addition, the function of the communication section 114 can be more reliably stopped by providing a power shutdown section 126 capable of selectively shutting down the power of a section related to the function of the communication section 114.

As described above, since the portable information device 110 according to the present embodiment includes the high-quality piezoelectric vibrator 50, the portable information device 110 can also similarly have high quality. In addition to this, it is possible to display the highly precise clock information which is stable over a long period of time.

Next, a radio-controlled timepiece according to still another embodiment of the invention will be described with reference to FIG. 26.

Figure 26:
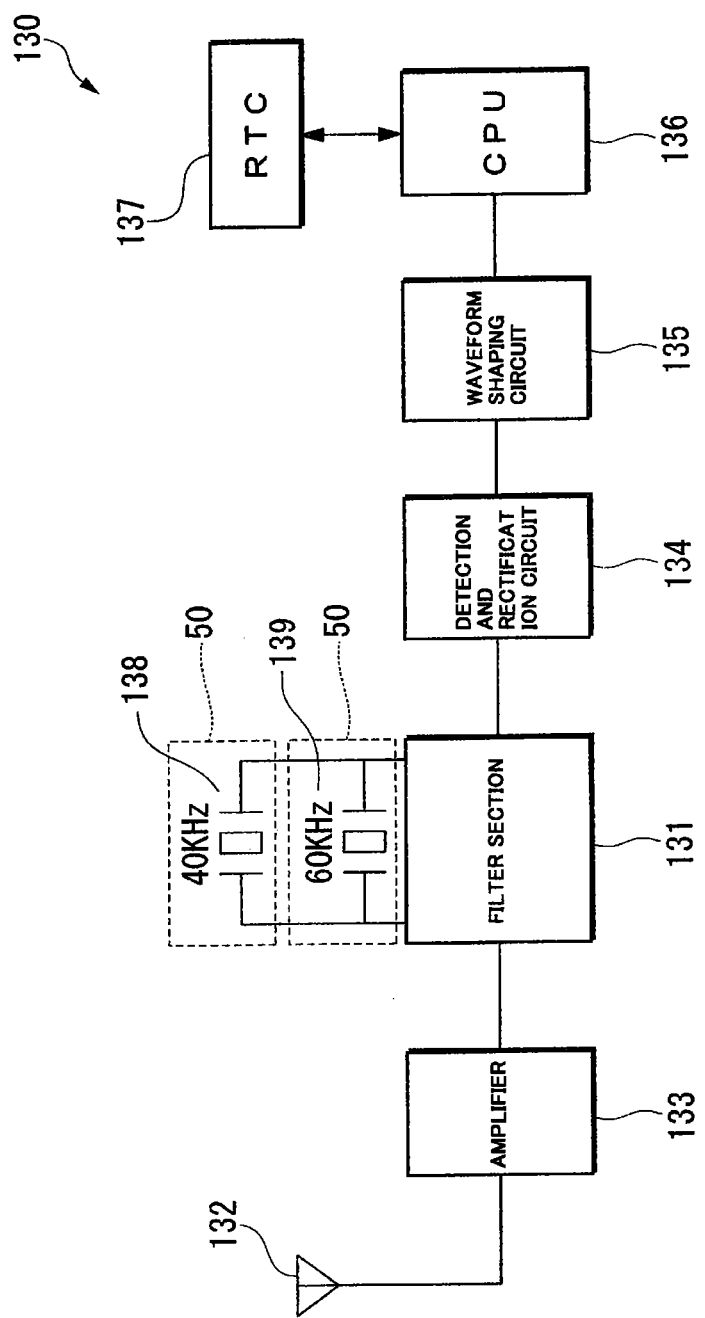
FIG. 26 is a view showing the configuration of a radio-controlled timepiece according to an embodiment of the invention.

As shown in FIG. 26, a radio-controlled timepiece 130 according to the present embodiment includes the piezoelectric vibrators 50 electrically connected to a filter section 131. The radio-controlled timepiece 130 is a timepiece with a function of receiving a standard radio wave including the clock information, automatically changing it to the correct time, and displaying the correct time.

In Japan, there are transmission centers (transmission stations) that transmit a standard radio wave in Fukushima Prefecture (40 kHz) and Saga Prefecture (60 kHz), and each center transmits the standard radio wave. A long wave with a frequency of, for example, 40 kHz or 60 kHz has both a characteristic of propagating along the land surface and a characteristic of propagating while being reflected between the ionospheric layer and the land surface, and therefore has a propagation range wide enough to cover the entire area in Japan through the two transmission centers.

(Radio-Controlled Timepiece)

Hereinafter, the functional configuration of the radio-controlled timepiece 130 will be described in detail.

An antenna 132 receives a long standard radio wave with a frequency of 40 kHz or 60 kHz. The long standard radio wave is obtained by performing AM modulation of the time information, which is called a time code, using a carrier wave with a frequency of 40 kHz or 60 kHz. The received long standard wave is amplified by an amplifier 133 and is then filtered and synchronized by the filter section 131 having the plurality of piezoelectric vibrators 50.

In the present embodiment, the piezoelectric vibrators 50 include crystal vibrator sections 138 and 139 having resonance frequencies of 40 kHz and 60 kHz, respectively, which are the same frequencies as the carrier frequency.

In addition, the filtered signal with a predetermined frequency is detected and demodulated by a detection and rectification circuit 134.

Then, the time code is extracted by a waveform shaping circuit 135 and counted by the CPU 136. The CPU 136 reads the information including the current year, the total number of days, the day of the week, the time, and the like. The read information is reflected on an RTC 137, and the correct time information is displayed. Because the carrier wave is 40 kHz or 60 kHz, a vibrator having the tuning fork structure described above is suitable for the crystal vibrator sections 138 and 139.

Moreover, although the above explanation has been given for the case in Japan, the frequency of a long standard wave is different in other countries. For example, a standard wave of 77.5 kHz is used in Germany. Therefore, when the radio-controlled timepiece 130 which is also operable in other countries is assembled in a portable device, the piezoelectric vibrator 50 corresponding to frequencies different from the frequencies used in Japan is necessary.

As described above, since the radio-controlled timepiece 130 according to the present embodiment includes the high-quality piezoelectric vibrator 50, the radio-controlled timepiece 130 can also similarly have high quality. In addition to this, it is possible to count a time precisely and stably over a long period of time.

While the embodiments of the invention have been described in detail with reference to the accompanying drawings, the specific configuration is not limited to the above-described embodiments, and various changes may be made in design without departing from the spirit of the invention.

For example, although the vibrating arms 3 and 4 of the light shielding film pattern 35 with the damage K are connected to form the defective pattern 33a in the embodiment described above, the outer shape may be changed in such a manner that the electrical properties of a piezoelectric vibrating reed, which is formed from an outer shape equivalent region where a defect is present, deviates from a predetermined range in the electrical property test step without being limited to that described above.

Figure 27:
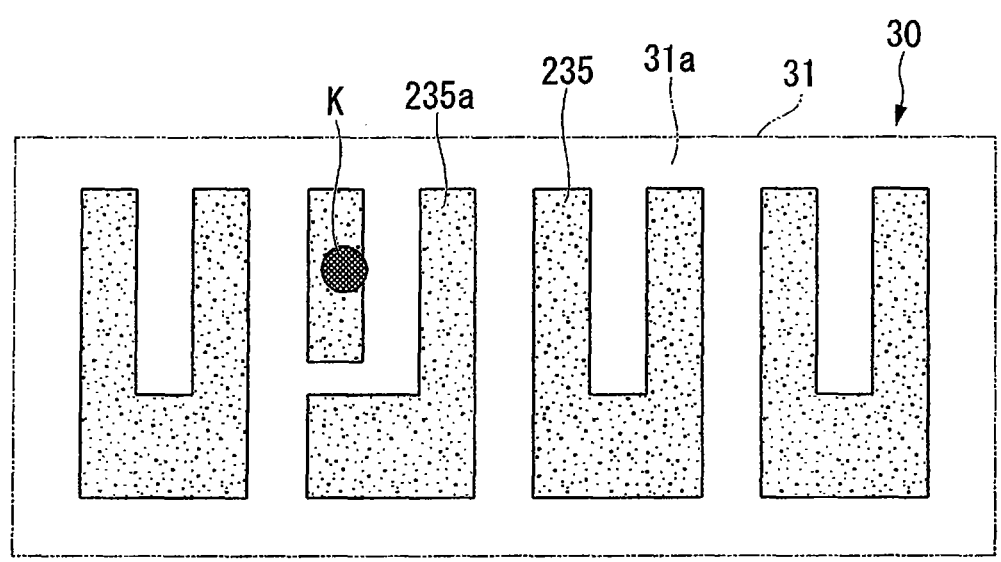
FIG. 27 is a process view showing a method of manufacturing a piezoelectric vibrating reed according to another embodiment and is also a plan view of a photomask.

In addition, although the case where the rubber based negative resist was used as the photoresist film 25 was described in the above embodiment, a positive resist may also be used. However, in the case of a photomask when a positive resist is used for a photoresist film, it is necessary to form a light shielding film pattern 235, which has the same shape as the outer shape of the piezoelectric vibrating reed 1, in a region where the photoresist film 25 remains, that is, in the outer shape equivalent region as shown in FIG. 27, unlike the case where a negative resist is used.

For this reason, in the case where a positive resist is used, if there is the damage K on the light shielding film pattern 235 in the photomask 30, a portion equivalent to at least one vibrating arm of a piezoelectric vibrating reed in the light shielding film pattern 235 with the damage K is removed by a laser to form a defective pattern 235a. As a result, a defective piezoelectric vibrating reed from which vibrating arms have been removed is formed on the wafer S equivalent to the defective pattern 235a. Since this piezoelectric vibrating reed does not vibrate, a defective product and a non-defective product can be correctly sorted out in the electrical property test or the like.

In addition, although the surface mount type piezoelectric vibrator 50 was described as an example, the invention may also be applied to a cylinder package type piezoelectric vibrator without being limited to the surface mount type piezoelectric vibrator.

Moreover, the invention is not limited to the tuning fork type piezoelectric vibrating reed 1. For example, it may be a thickness-shear vibrating reed. That is, an exposure pattern with damage may be made to be different from the outer shape of a non-defective thickness-shear vibrating reed, so that a non-defective product and a defective product can be easily sorted out in the electrical property test.

In addition, although the case of forming the outer pattern of a piezoelectric vibrating reed was described in the above embodiment, the invention may also be applied to each step of performing patterning by contact exposure, such as when forming the groove 6 or when forming electrodes, without being limited to the above case.

What is claimed is:

1. A method for preparing piezoelectric reeds, comprising:
   (a) providing a wafer substantially consistent in thickness across the wafer;
   (b) inspecting a reusable photomask to find if there is any defect therein, wherein the photomask comprises sections with different opacities patterned to draw a series of geometric representations representative of the piezoelectric reeds;
   (c) changing a geometry of one of the representations in the photomask in which a defect is found, to a degree sufficient for a piezoelectric reed resulting from the changed geometric representation to behave electrically differently from other reeds resulting from unchanged geometric representations; and
   (d) placing the photomask in contact with the wafer and irradiating the wafer through the photomask.

2. The method according to claim 1, wherein the method further comprises forming a material on the wafer comprising one of a positive photoresist and a negative photoresist.

3. The method according to claim 1, wherein changing a geometry of one of the representations will render the resulting piezoelectric reed inoperable.

4. The method according to claim 3, wherein the piezoelectric reed comprises a pair of arms, and changing a geometry of one of the representations will make arms of the resulting piezoelectric reed connected together at both ends thereof.

5. The method according to claim 1, wherein placing the photomask in contact with the wafer and irradiating the wafer through the photomask comprising placing a pair of the photomasks respectively in contact with both sides of the wafer and irradiating both sides of the wafer through the photomasks.

6. The method according to claim 1, further comprising before step (d):
   forming a metal film onto a surface of the wafer; and
   forming a photo-resistive layer onto the metal film, wherein placing the photomask in contact with the wafer comprises placing the photomask in contact with the photo-resistive layer.

7. The method according to claim 6, further comprising after step (d):

removing a part of the photo-resistive layer to leave the photo-resistive layer in shapes representative of the piezoelectric reeds;

removing a part of the metal film not covered by the photo-resistive layer;

removing the remaining photo-resistive layer; and etching the wafer to remove a part of the wafer not covered by the metal film.

8. The method according to claim 1, further comprising testing the piezoelectric reeds to identify the piezoelectric reed resulting from the changed geometric representation of the photomask.

\* \* \* \* \*